(12) United States Patent
Taylor et al.

(10) Patent No.: US 7,358,724 B2
(45) Date of Patent: Apr. 15, 2008

(54) INTEGRATED MAGNETIC FLUX CONCENTRATOR

(75) Inventors: William P. Taylor, Amherst, NH (US); Richard Dickinson, Manchester, NH (US); Michael C. Doogue, Manchester, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 19 days.

(21) Appl. No.: 11/129,933

(22) Filed: May 16, 2005

(65) Prior Publication Data

US 2006/0255797 A1    Nov. 16, 2006

(51) Int. Cl.
  *G01R 33/00*    (2006.01)
(52) U.S. Cl. ...................................... 324/260
(58) Field of Classification Search ................. 324/260
  See application file for complete search history.

(56) References Cited

U.S. PATENT DOCUMENTS

| | | | |
|---|---|---|---|
| 4,262,275 A * | 4/1981 | DeMarco et al. | 338/32 H |
| 4,772,929 A | 9/1988 | Manchester | |
| 5,196,821 A * | 3/1993 | Partin et al. | 338/32 R |
| 6,501,268 B1 | 12/2002 | Edelstein et al. | |
| 7,046,002 B1 * | 5/2006 | Edelstein | 324/244 |
| 2004/0155644 A1 | 8/2004 | Stauth et al. | |
| 2005/0045359 A1 | 3/2005 | Doogue et al. | |

FOREIGN PATENT DOCUMENTS

| DE | WO9007176 | * 6/1990 |
|---|---|---|
| EP | 0 537 419 A1 | 4/1993 |
| EP | 1 443 332 A1 | 8/2004 |

OTHER PUBLICATIONS

Arnold et al.; "Hall Effect Detector and Miniswitch;" IBM Technical Disclosure Bulletin; vol. 17, No. 11; Apr. 1975; XP002404264; 1 sheet.
Baltes; "Future of IC Microtransducers;" Sensors & Actuators A, Elsevier Sequoia S.A. Lausanne; vol. 56, No. 1; Aug. 1996; XP004013031; pp. 179-192.
Blanchard et al.; "Highly Sensitive Hall Sensor in CMOS Technology;" Sensors & Actuators A, Elsevier Sequoia S.A. Lusanne, CH; vol. 85, No. 1-3, May 2000; XP004198253; pp. 144-148.
Cheng et al.; "Effects of Spacer Layer on Growth, Stress & Magnetic Properties of Sputtered Permalloy Film;" Journal of Magnetism and Magnetic Materials; Elsevier Science Publishers, Amsterdam, NL; vol. 282, Nov. 2004; XP004600327; pp. 109-114.
Daughton; "GMR & SDT Sensor Applications;" IEEE Transactions on Magnetics, vol. 36, No. 5; Sep. 2000; XP011111032900; XP011032900; pp. 2773-2778.
Edelstein et al.; "Minimizing 1/f Noise in Magnetic Sensors Using a Microelectromechanical System Flux Concentrator;" Journal of Applied Physics; American Institute of Physics; New York; US; vol. 91, No. 10, May 15, 2002; XP012054955; pp. 7795-7797.

(Continued)

*Primary Examiner*—Reena Aurora
(74) *Attorney, Agent, or Firm*—Daly, Crowley, Mofford & Durkee, LLP

(57) ABSTRACT

A method and apparatus provide a substrate having a depression into which a magnetic material is disposed, forming a magnetic flux concentrator and/or a permanent magnet. A magnetic field sensing element can be disposed proximate to the depression.

29 Claims, 15 Drawing Sheets

OTHER PUBLICATIONS

Frick et al., "40.2: CMOS Microsystem for AC Current Measurement with Galvanic Isolation;" Proceedings of IEEE Sensors 2002; IEEE Int'l Conference on Sensors; New York, NY; vol. 1 of 2, Conf. 1; Jun. 12, 2002; XP010605334; pp. 1445-1450.

Katyl; "Edge-Mounted Hall Cell Sensor;" IBM Technical Disclosure Bulletin; vol. 22, No. 8A; Jan. 1, 1980; XP002404265; pp. 3165.

Katyl; "Flux Concentrator for Magnetic Field Sensor Transistor;" IP.COM Journal; IP.COM Inc., West Henrietta, NY; Jun. 1, 1980; XP013044766; 3 sheets.

Leichle et al.; "A Micromachined Resonant Magnetic Field Sensor;" Proceedings of the IEEE 14th Annual Int'l Conference on Microelectro Mechanical Systems. MEMS 2001; Interlaken, CH; Jan. 21, 2001; XP010534603; pp. 274-277.

Popovic et al.; "Integrated Hall Sensor / Flux Concentrator Microsystems;" Informacije Midem; Ljubljana, SI; Oct. 10, 2001; XP002253614; pp. 215-216.

Popovic; "Non-Plate-Like Hall Magnetic Sensors & Their Applications;" Sensors & Actuators A; Elsevier Sequoia S.A.; Lusanne, CH; vol. 85, No. 1-3; Aug. 25, 2000; XP004214441; pp. 9-17.

Schneider et al., "Integrated Flux Concentrator Improves CMOS Magnetotransistors;" Proceedings of the Workshop on Micro Electrical Mechanical Systems; Amsterdam, NL; Jan. 29, 1995; XP000555259; pp. 151-156.

Steiner et al.; "Fully Packages CMOS Current Monitor Using Lead-On-Chip Technology;" Micro Electro Mechanical Systems; 1998 Proceedings of 11th Annual Int'l Workship On; Heidelberg, DE; Jan. 25, 1998; XP010270266; pp. 603-608.

PCT Search Report and Written Opinion of the ISA for PCT/US2006/016531 dated Nov. 13, 2006.

Steiner et al.; "Full Packaged CMOS Current Monitor Using Lead-On-Chip Technology;" 1998 IEEE; 0-7803-4112-X98; Jan. 1998; pp. 603-608.

\* cited by examiner

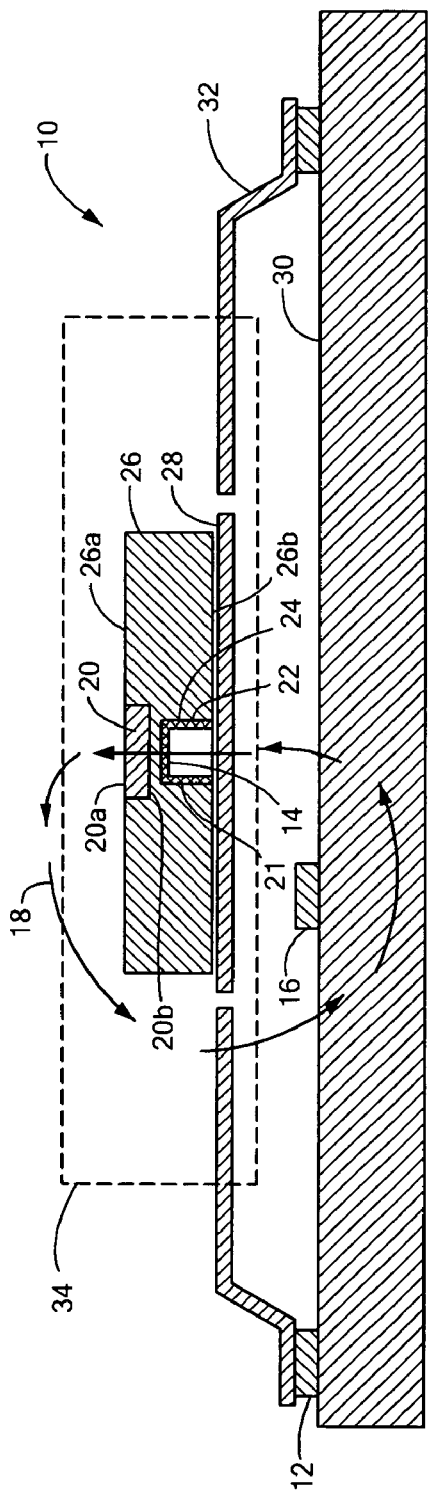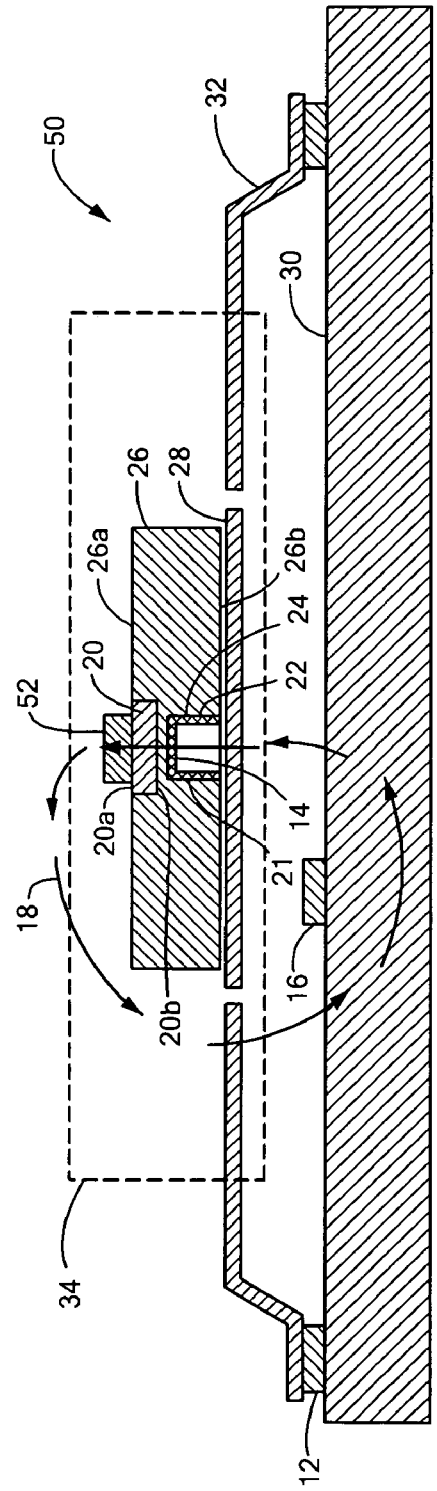

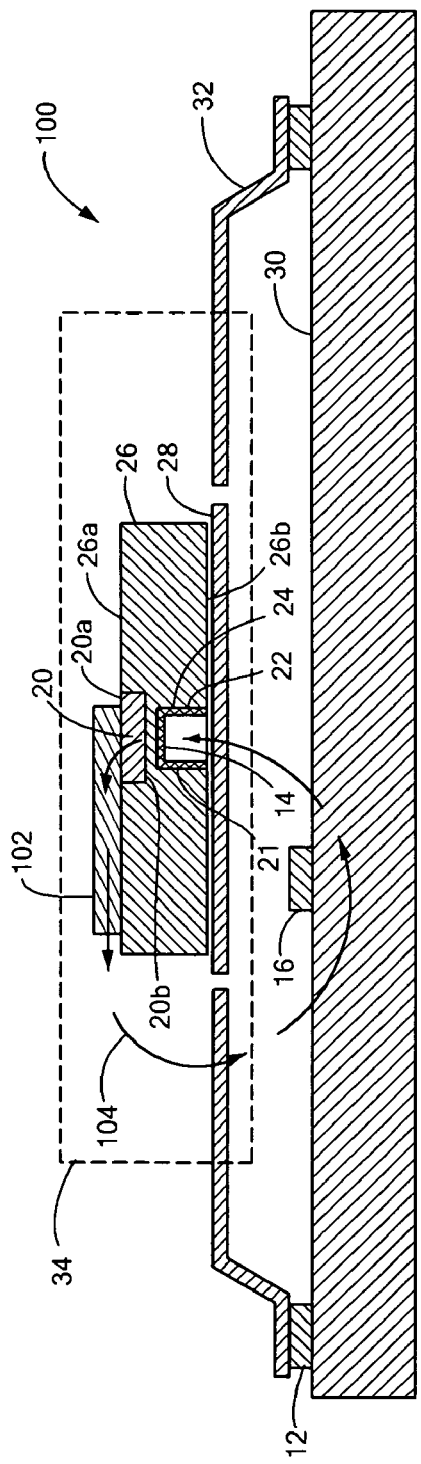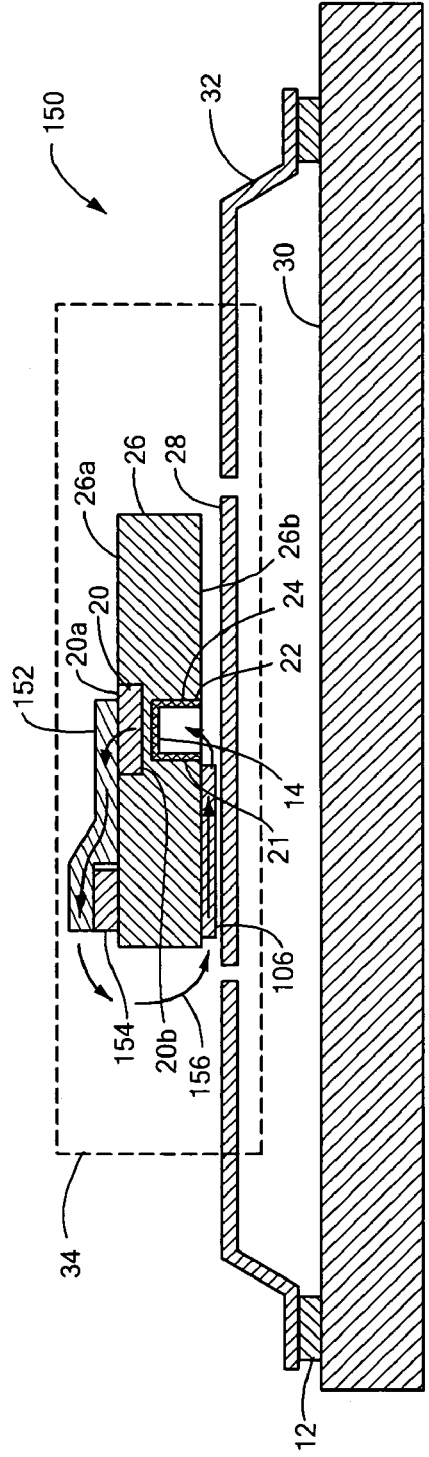
FIG. 1B
FIG. 1C

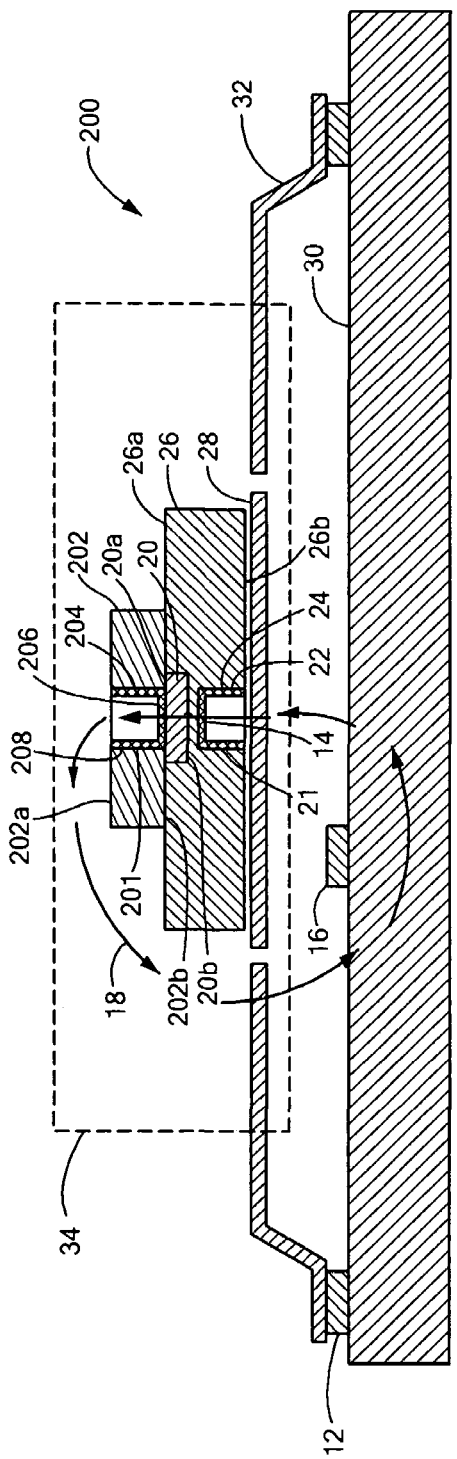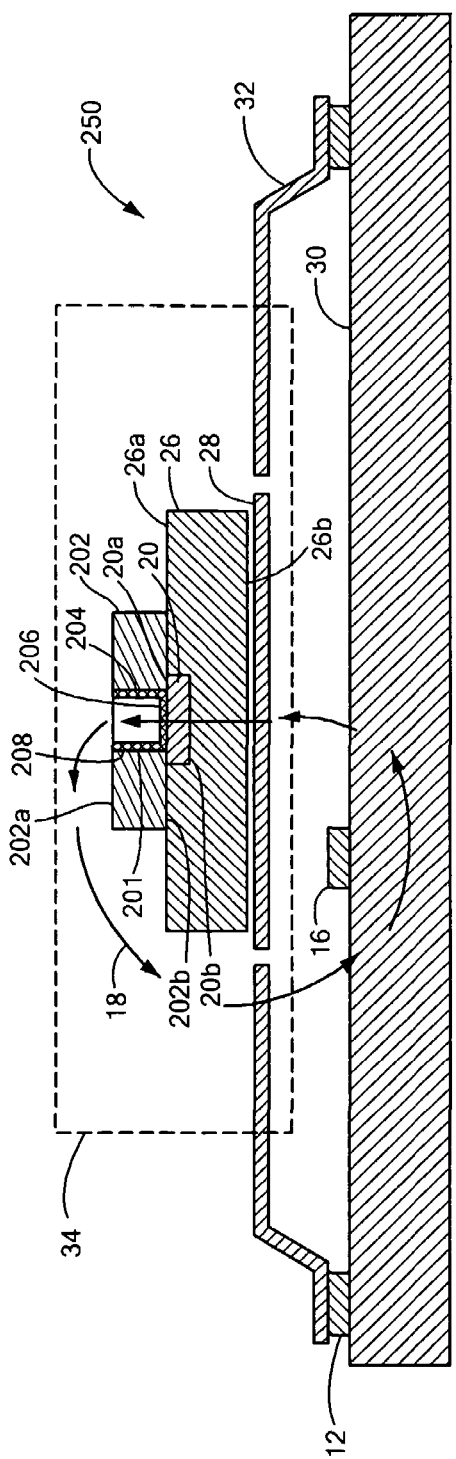

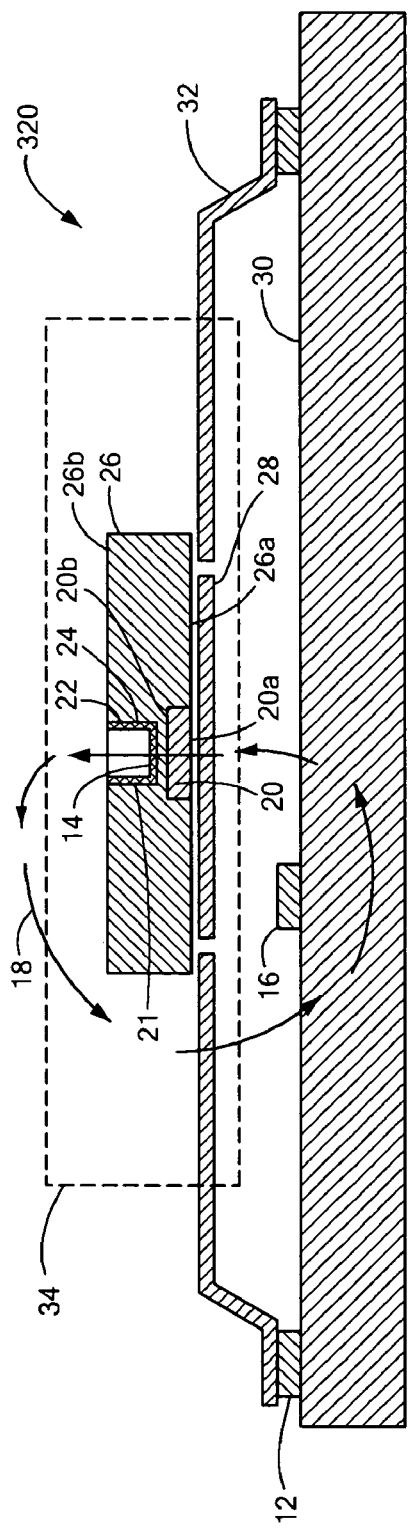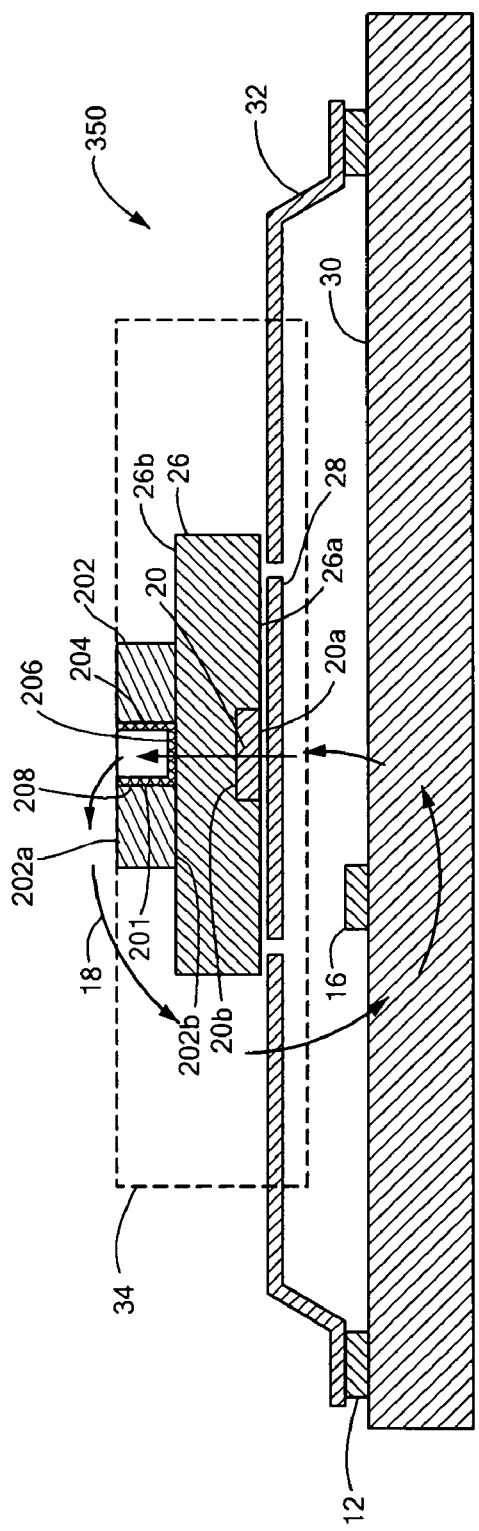

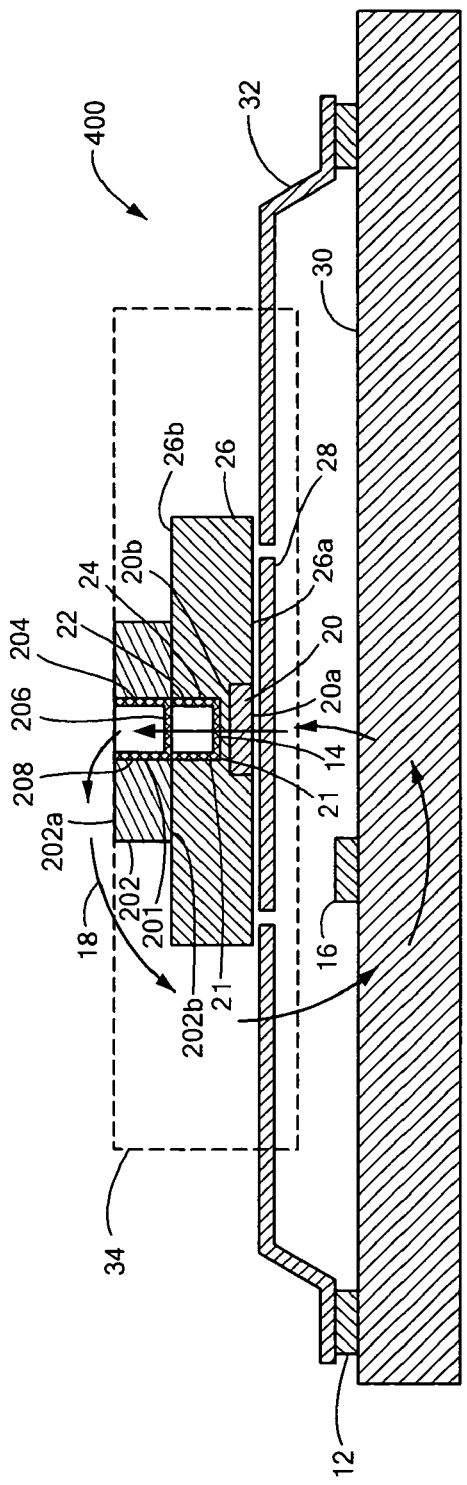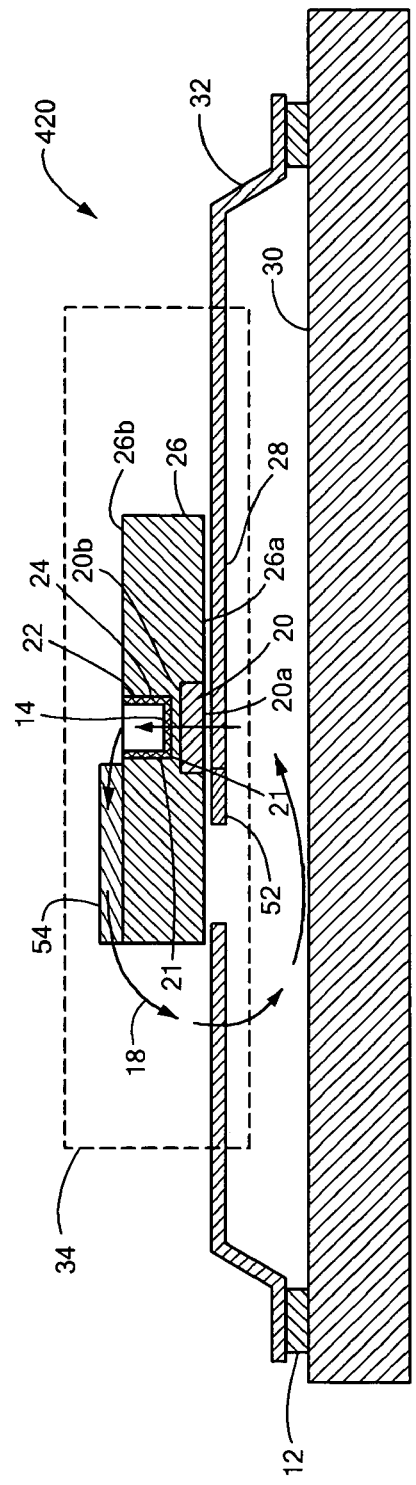
FIG. 3B
FIG. 3C

INTEGRATED MAGNETIC FLUX CONCENTRATOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuits and, more particularly, to an integrated circuit substrate in which a magnetic flux concentrator and/or a permanent magnet is formed.

BACKGROUND OF THE INVENTION

Current sensors are known to those of ordinary skill in the art. One type of conventional current sensor uses a magnetic field sensing element (for example a Hall effect element or magnetoresistance element) in proximity to an electrical conductor. The magnetic field sensing element generates an output signal having a magnitude proportional to the magnetic field induced by an electrical current that flows through the electrical conductor. Therefore, it will be understood that the current sensor senses a magnetic field associated with the electrical current.

Some typical current sensors include a gapped toroid magnetic flux concentrator, with the magnetic field sensing element positioned in the toroid gap. The magnetic field sensing element and toroid are assembled into a housing, which is mountable on a printed circuit board. In use, an electrical conductor, such as a wire, is passed through the center of the toroid. The toroid acts as a magnetic flux concentrator, providing an increased magnetic field through the magnetic field sensing element, and therefore, a more sensitive device. However, such devices tend to be undesirably large, both in terms of height and circuit board area.

Proximity detectors (also referred to herein as rotation detectors) for detecting ferromagnetic or magnetic objects are also known. One application for such devices is in detecting the approach and retreat of each tooth of a rotating ferromagnetic object, such as a ferromagnetic gear. The magnetic field associated with the ferromagnetic object is often detected by one or more magnetic field sensing elements, such as Hall elements or magnetoresistance elements, which provide a signal proportional to a detected magnetic field (i.e., a magnetic field signal). The proximity detector processes the magnetic field signal to generate an output signal that changes state each time the magnetic field signal crosses a threshold. Therefore, when the proximity detector is used to detect the approach and retreat of each tooth of a rotating ferromagnetic gear, the output signal is a square wave representative of rotation of the ferromagnetic gear. It will be understood that the proximity detector, like the current sensor described above, senses a magnetic field. The proximity detector senses a magnetic field associated, for example, with the gear teeth.

Magnetic field sensors are also known. Like the current sensor and the proximity detector described above, one type of magnetic field sensor uses a magnetic field sensing element (for example a Hall effect element or magnetoresistance element) in the presence of a magnetic field. The magnetic field sensing element generates an output signal having a magnitude proportional to the magnetic field. It will be understood that the magnetic field sensor, like the proximity detector and the current sensor, senses a magnetic field.

Various parameters characterize the performance of current sensors, proximity detectors, and magnetic field sensors, including sensitivity and linearity. Sensitivity is related to the magnitude of a change in the output from the magnetic field sensing element used in the current sensor, proximity detector, or magnetic field sensor in response to a sensed current, a sensed ferromagnetic object, or a magnetic field, respectively. Linearity is related to the degree to which the output of the magnetic field sensing element varies in direct proportion to the sensed current, the sensed ferromagnetic object, or the sensed magnetic field, respectively. One of ordinary skill in the art will recognize that above-described output can either be in the form of a voltage output or a current output.

The sensitivity of the current sensor, the proximity detector, and the magnetic field sensor is related to a variety of factors. One important factor is the magnitude of the sensed magnetic field. For this reason, some current sensors, proximity detectors, and magnetic field sensors use a flux concentrator disposed in order to concentrate a magnetic flux and to direct the concentrated magnetic flux through the magnetic field sensing element.

It will be understood that the amount of sensitivity improvement provided by a magnetic flux concentrator is related to a separation between the magnetic flux concentrator and the magnetic field sensing element. It will also be understood that both sensitivity and linearity are reduced if the magnetic flux concentrator becomes magnetically saturated.

A prior art approach to provide a magnetic flux concentrator in proximity to a magnetic field sensing element is described in *Fully Packaged CMOS Integrated Current Monitor Using Lead-On-Chip Technology*, R. Steiner et al., 0-7803-4412-X/98, IEEE, 1998. In this approach a bottom surface of a substrate is etched under and proximate to a magnetic field sensing element disposed on the top surface of the substrate. The etching provides a V-shaped channel into which a soft magnetic material is disposed, resulting in a magnetic flux concentrator close to the magnetic field sensing element. The resulting V-shaped magnetic field concentrator, though close to the magnetic field sensing element, tends to saturate at the apex of the channel, due to the V-shape. As described above, the saturation tends to reduce linearity in the magnetic field sensing element.

SUMMARY OF THE INVENTION

The present invention provides a flux concentrator apparatus, which can be used in a current sensor, a proximity detector, and a magnetic field sensor (collectively referred to herein as integrated sensors) having a magnetic field sensing element and a magnetic flux concentrator integrated together in a packaged integrated circuit.

In accordance with the present invention, an apparatus includes a substrate having first and second opposing surfaces and a magnetic field sensing element disposed on the first surface of the substrate. The magnetic field sensing element has first and second opposing magnetic field sensing element surfaces generally parallel to the first surface of the substrate. The apparatus further includes a depression disposed in the second surface of the substrate, which is generally aligned with the magnetic field sensing element. The depression has a first depression surface generally parallel to the first surface of the substrate and adjacent to the magnetic field sensing element and a second depression surface adjacent to the first depression surface. A magnetic material layer is disposed on at least one of the first depression surface and the second depression surface.

In some embodiments, the apparatus further includes a second substrate having first and second opposing surfaces, wherein the second surface of the second substrate is disposed over a selected one of the first surface of the substrate and the second surface of the substrate. The first surface of the second substrate is disposed over the second surface of the second substrate. A concentrator apparatus depression is disposed in at least one of the first surface and the second surface of the second substrate and is generally aligned with the magnetic field sensing element. The concentrator apparatus depression has at least one of a first concentrator apparatus depression surface generally parallel to the second surface of the second substrate and a second concentrator apparatus depression surface. A concentrator apparatus magnetic material layer is disposed on at least one of the first concentrator apparatus depression surface and the second concentrator apparatus depression surface.

In accordance with another aspect of the present invention, an apparatus for concentrating a magnetic flux includes a substrate having first and second opposing surfaces and a depression disposed in at least one of the first surface and the second surface of the substrate. The depression has at least one of a first depression surface generally parallel to the second surface of the substrate and a second depression surface. A magnetic material layer is disposed on at least one of the first depression surface and the second depression surface.

In some embodiments, the apparatus further includes a second substrate having first and second opposing surfaces, and a magnetic field sensing element disposed on a selected one of the first surface and the second surface of the second substrate. The magnetic field sensing element has first and second opposing magnetic field sensing element surfaces generally parallel to the first surface of the second substrate. The second surface of the substrate is disposed over the first surface of the second substrate and the first surface of the substrate is disposed over the second surface of the substrate. The depression is generally aligned with the magnetic field sensing element.

In accordance with a still further aspect of the present invention, a method of manufacturing a magnetic flux concentrator includes etching a second surface of a substrate having first and second opposing surfaces to provide a depression having at least one of a first depression surface generally parallel to the first surface of the substrate and a second depression surface, and depositing a magnetic material layer on at least one of the first depression surface and the second depression surface.

In some embodiments, the method also includes depositing a magnetic field sensing element on the first surface of the substrate, which is generally aligned with the depression.

BRIEF DESCRIPTION OF THE DRAWINGS

The foregoing features of the invention, as well as the invention itself may be more fully understood from the following detailed description of the drawings, in which:

FIG. 1 is a pictorial of an apparatus having a substrate with a depression to form a magnetic flux concentrator;

FIG. 1A is a pictorial of an apparatus having a substrate with a depression to form a magnetic flux concentrator and having a surface magnetic material layer;

FIG. 1B is a pictorial of an apparatus having a substrate with a depression to form a magnetic flux concentrator, having a surface magnetic flux concentrator, and having a soft magnetic material layer extension;

FIG. 1C is a pictorial of an apparatus having a substrate with a depression to form a magnetic flux concentrator having soft magnetic material layer extensions and having a current carrying conductor;

FIG. 2 is a pictorial of an apparatus having a substrate with a depression to form a magnetic flux concentrator and having a concentrator apparatus;

FIG. 2A is a pictorial of a concentrator apparatus disposed proximate to a substrate;

FIG. 3 is a pictorial of another embodiment of the apparatus of FIG. 1, in which the substrate is flipped;

FIG. 3A is a pictorial of another embodiment of the apparatus of FIG. 2A, in which the substrate is flipped;

FIG. 3B is a pictorial of another embodiment of the apparatus of FIG. 2, in which the substrate is flipped;

FIG. 3C is a pictorial of another embodiment of an apparatus having a substrate with a depression to form a magnetic flux concentrator in which the substrate is flipped;

DETAILED DESCRIPTION OF THE INVENTION

Figure 4:
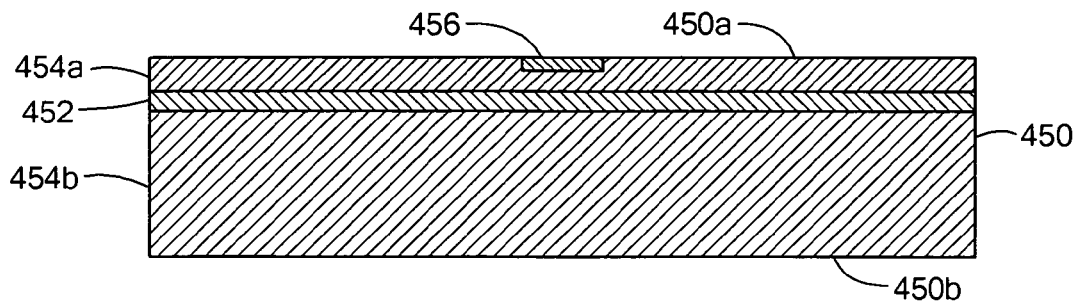
FIGS. 4-4D are block diagrams showing a sequence of fabrication steps to fabricate the apparatus of FIG. 1A.

As used herein, the term "magnetic material" is used to refer to a soft magnetic material having a relatively high magnetic permeability, low coercivity, and low remanence, and also to a hard magnetic material having both a relatively large remanence and large coercivity.

Referring to FIG. 1, an apparatus 10, includes a substrate 26 having first and second opposing surfaces 26a, 26b, respectively. The apparatus 10 also includes a magnetic field sensing element 20 disposed on the first surface of the substrate, having first and second opposing magnetic field sensing element surfaces 20a, 20b, respectively, generally parallel to the first surface 26a of the substrate 26. A depression 24 can be disposed in the second surface 26b of the substrate 26. The depression 24 is generally aligned with the magnetic field sensing element 20. The depression 24 has a first depression surface 14 generally parallel to the first surface 26a of the substrate 26 and adjacent to the magnetic field sensing element 24 and a second depression surface 22 adjacent to the first depression surface 14. A soft magnetic material layer 21 is disposed on at least one of the first depression surface 14 and the second depression surface 22.

The soft magnetic material layer 21 is comprised of a soft magnetic material including, but not limited to, a ferrite material, Permalloy, NiFeMo, Supermalloy, a Nickel alloy, an Iron alloy, a Cobalt alloy, and/or a Manganese alloy. The soft magnetic material layer 21 can be deposited in the depression 24 with a selected one of a plating process, a sputtering process, and an electron beam process. In some embodiments, an insulating layer (not shown) is deposited under the soft magnetic material layer 21, between the soft magnetic material layer 21 and the substrate 26. The insulating layer can be, for example, a silicon dioxide material, grown thermally or deposited by an LPCVD or PECVD process.

In some embodiments, the second depression surface 22 is generally perpendicular to the first depression surface 14. In some embodiments, the depression 24 is formed using a deep reactive ion etch (DRIE) process.

The substrate 26 in combination with a lead frame having leads, of which a lead 32 is but one example, and having a base plate 28, forms an integrated circuit. A body 34 can encapsulate the integrated circuit.

The integrated circuit can be disposed on a circuit board 30 having a current carrying conductor 16. In operation, a current passing through the current carrying conductor 16 generates a magnetic field 18, which tends to concentrate in the soft magnetic material layer 21. While only one magnetic flux line is shown, it will be appreciated that lines of magnetic flux tend to concentrate in the region of the soft magnetic material layer 21. The concentrated magnetic field in the soft magnetic material layer 21 is in proximity to the magnetic field sensing element 20, and therefore, tends to result in a higher sensitivity associated with the magnetic field sensing element 20, wherein the higher sensitivity is in response to the current flowing in the current carrying conductor 16.

The current carrying conductor 16 is disposed generally to the side of the magnetic field sensing element 20 and the depression 24, resulting in the magnetic field 18 passing through the magnetic field sensing element 20 in a direction generally perpendicular to the first surface 26a of the substrate 26. However, it should be appreciated that, in other embodiments, the current carrying conductor 16 can be substantially vertically aligned with the magnetic field sensing element 20 and with the depression 24. In these embodiments, a magnetic flux will still tend to concentrate in the depression 24, but in a direction generally parallel to the first surface 26a of the substrate. This arrangement is particularly useful in embodiments for which the soft magnetic material layer 21 is disposed only on the second surface 22 of the depression 24 and for which the depression 24 is wider than the magnetic field sensing element 20.

It will be appreciated that some types of magnetic field sensing elements, when disposed on a major surface of a substrate, are responsive to magnetic fields in a direction generally perpendicular to the major surface of the substrate and other types of magnetic field sensors are responsive to magnetic fields in a direction generally parallel to the major surface of the substrate. For example, a Hall effect element is responsive to the perpendicular magnetic field, while a magnetoresistance element and a vertical Hall element are responsive to the parallel magnetic field. Therefore, the magnetic field sensing element 20 can be of a type including, but not limited to, a Hall element, a magnetoresistance element, and a vertical Hall element.

Embodiments for which the magnetic field is in a direction generally parallel to the first surface 26a of the substrate 26 can use for example, a magnetoresistance element or a vertical Hall element as the magnetic field sensing element 20. Embodiments for which the magnetic field is in a direction generally vertical to the first surface 26a of the substrate can use for example, a conventional Hall element.

In some embodiments, the soft magnetic material layer 21 is not deposited on the first depression surface 14. In other embodiments, the soft magnetic material layer 21 is not deposited on the second depression surface 22, or is deposited on only portions of the second depression surface 22.

While the second surface 22 of the depression 24 is shown to be generally perpendicular to the first surface 14 of the depression, in other embodiments, the second surface 22 can be at any angle relative to the first surface 14.

It will be understood that magnetic fields concentrated in the soft magnetic material layer 21 will tend to saturate the soft magnetic material layer 21 at a higher magnetic field strength as compared to a depression having another shape, for example, a V-shape, or pyramid shape, which have no first surface 14.

Referring now to FIG. 1A, in which like elements of FIG. 1 are shown having like reference designations, another apparatus 50 includes a surface magnetic flux concentrator 52. The surface magnetic flux concentrator 52 is also in proximity to the magnetic field sensing element 20, and therefore, tends to result in a higher sensitivity associated with the magnetic field sensing element 20. In some embodiments, an insulator layer (not shown) is disposed between the surface magnetic flux concentrator 52 and the magnetic field sensing element 20.

Referring now to FIG. 1B, in which like elements of FIG. 1 are shown having like reference designations, yet another apparatus 100 includes a soft magnetic material layer extension 102 disposed on the first surface 26a of the substrate. The soft magnetic material layer extension 102 is disposed in a direction generally toward the current carrying conductor 16, and therefore, tends to capture and concentrate a magnetic field 104 in the vicinity of the magnetic field sensing element 20 more than if the soft magnetic material layer extensions 102 were not present.

The soft magnetic material layer extension 102 can be formed on the substrate 26 with a variety of processes, including but not limited to, a plating process, a sputtering process, and an electron beam process. In some embodiments, the soft magnetic material layer extension 102 fabrication process can include a photolithography step, a lift-off step, and/or an etching step.

In some embodiments, the soft magnetic material layer extension 102 generally overlaps the magnetic field sensing element 20. In some embodiments, an insulator layer (not shown) is disposed between the soft magnetic material layer extension 102 and the magnetic field sensing element 20.

Referring now to FIG. 1C, in which like elements of FIG. 1 are shown having like reference designations, yet another apparatus 150 includes a first soft magnetic material layer extension 152 disposed on the first surface 26a of the substrate 26 and the second soft magnetic material layer extension 106 disposed on the second surface 26b of the substrate 26. A current carrying conductor 154 is disposed on the first surface 26a of the substrate 26. At least a portion of the first soft magnetic material layer extension 152 can be disposed over (or proximate to) the current carrying conductor 154.

The first and second soft magnetic material layer extensions 152, 106 are disposed in a direction directed toward the current carrying conductor 154, and therefore, tend to capture and concentrate a magnetic field 156 in the vicinity of the magnetic field sensing element 20 more than if the first and second soft magnetic material layer extensions 152, 106 were not present.

In some embodiments, an insulting layer (not shown) is disposed between the first soft magnetic material layer extension 152 and the current carrying conductor 154. In some embodiments, and insulting layer (not shown) is disposed between the substrate 26 and the second soft magnetic material extension 106 The insulating layers can include, but are not limited to, silicon dioxide, silicon nitride, spin on glass, a polymer material (for example, benzocyclobutene (BCB), or a polyimide.

In operation, a current passing through the current carrying conductor 154 generates the magnetic field 156, which tends to concentrate in the depression 24 and in the first and second soft magnetic material layer extensions 152, 106. The concentrated magnetic field 156 in the depression 24 is in proximity to the magnetic field sensing element 20, and therefore, tends to result in a higher sensitivity associated with the magnetic field sensing element 20, wherein the higher sensitivity is in response to the current flowing in the current carrying conductor 154.

While one depression 24 is shown, having a soft magnetic material layer 21, in other embodiments, there can be more than one depression, each having a respective soft magnetic material layer. In one embodiment, depressions are disposed on opposite sides of the current carrying conductor 154. This embodiment may be useful for a magnetoresistive or vertical Hall sensor that senses a magnetic field parallel to the surface 26a. In the case of a current sensor, a trace 16 could be positioned underneath the device and between the two depressions.

The first and second soft magnetic material layer extensions 152, 106 can be formed on the substrate 26 with a variety of processes, including but not limited to, a plating process, a sputtering process, and an electron beam process. In some embodiments, the first and second soft magnetic material layer extension 106, 152 fabrication processes can include a photolithography step, a lift-off step, and/or an etching step.

Referring now to FIG. 2, in which like elements of FIG. 1 are shown having like reference designations, an apparatus 200 includes a concentrator apparatus 202 having a first surface 202a and a second surface 202b. In one particular embodiment, the concentrator apparatus 202 is formed from a second substrate, e.g., a silicon substrate. The concentrator apparatus 202 includes a concentrator apparatus depression 208 disposed in the first surface 202a and generally aligned with the magnetic field sensing element 20. The concentrator apparatus depression 208 has a first concentrator apparatus depression surface 206 generally parallel to and adjacent to the second surface 202b of the concentrator apparatus 202 and a second concentrator apparatus depression surface 204 adjacent to the first concentrator apparatus depression surface 206. The concentrator apparatus 200 also includes a soft magnetic material layer 201 disposed on at least one of the first concentrator apparatus depression surface 206 and the second concentrator apparatus depression surface 204.

In operation, a current passing through the current carrying conductor 16 generates the magnetic field 18, which tends to concentrate in the soft magnetic material layer 21 and in the soft magnetic material layer 201. The concentrated magnetic field 18 in the soft magnetic material layer 21 and in the soft magnetic material layer 201 is in proximity to the magnetic field sensing element 20, and therefore, tends to result in a higher sensitivity associated with the magnetic field sensing element 20, wherein the higher sensitivity is in response to the current flowing in the current carrying conductor 16.

Referring now to FIG. 2A, in which like elements of FIGS. 1 and 2 are shown having like reference designations, an apparatus 250 includes the concentrator apparatus 202 and no depression 24. It will be appreciated that a current passing through the current carrying conductor 16 generates the magnetic field 18, which tends to concentrate in the soft magnetic material layer 201, still resulting in a higher sensitivity associated with the magnetic field sensing element 20.

Referring now to FIG. 3, in which like elements of FIG. 1 are shown having like reference designations, an apparatus 320 includes the substrate 26, which is flipped relative to the substrate 26 of FIG. 1.

Referring now to FIG. 3A, in which like elements of FIG. 2A are shown having like reference designations, an apparatus 350 includes the substrate 26, which is flipped relative to the substrate 26 of FIG. 2A.

Referring now to FIG. 3B, in which like elements of FIG. 2 are shown having like reference designations, an apparatus 400 includes the substrate 26, which is flipped relative to the substrate 26 of FIG. 2.

Referring now to FIG. 3C, in which like elements of FIG. 2 are shown having like reference designations, an apparatus 420 includes the substrate 26, which is flipped, having the first surface 26a of the substrate 26 and the magnetic field sensing element 20 disposed downward. A lead frame has a plurality of leads, of which the lead 32 is but one example. The lead frame also includes a current conductor portion 52 of the lead frame formed from a coupling of at least two of the leads. It will be understood that the current conductor portion 52 extends into the page. The current conductor portion 52 is disposed proximate the first surface 26a of the substrate 26.

A soft magnetic material layer extension 54 can be disposed on the second surface 26b of the substrate 26. The soft magnetic material layer extension 54 can be the same as or similar to the soft magnetic material layer extension 102 of FIG. 1B.

It will be appreciated that having the current conductor portion 52 in close proximity to the magnetic field sensing element 20 tends to result in a higher sensitivity than embodiments, for example, the embodiment of FIG. 1, having a current carrying conductor 16 apart from the magnetic field sensing element 20.

Figure 11:
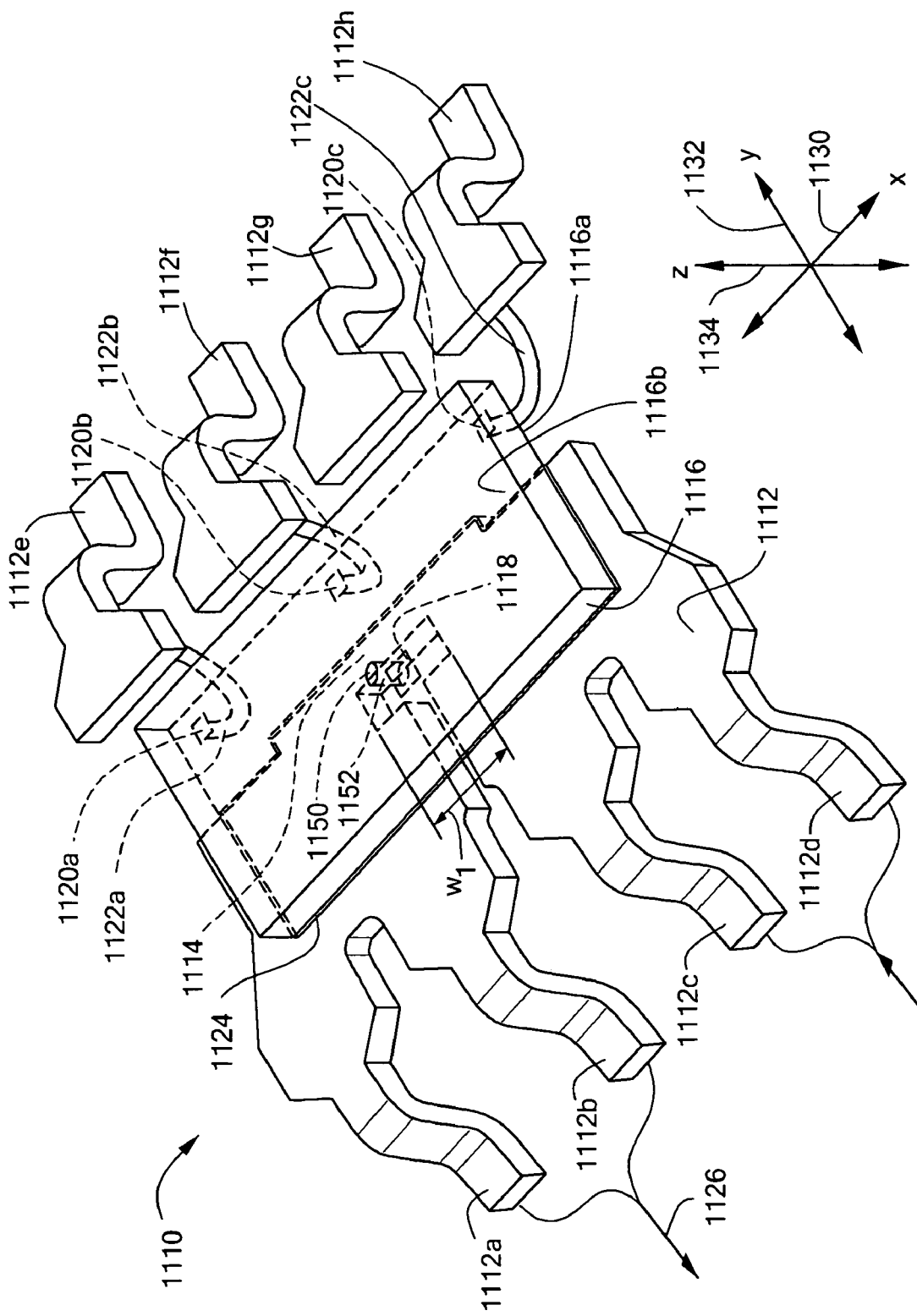
FIG. 11 is an isometric view of a current sensor having a substrate with a depression to form a magnetic flux concentrator in a flip-chip arrangement.

FIGS. 3-3C show embodiments for which the substrate 26 is flipped relative to other embodiments. It should be appreciated that the concentrator apparatus 202 of any of the embodiments set forth above can also be flipped, and the substrate 26 and the concentrator apparatus 202 can be flipped or not flipped in any combination. An isometric view of a particular flip-ship arrangement is shown in FIG. 11.

Figure 4A:
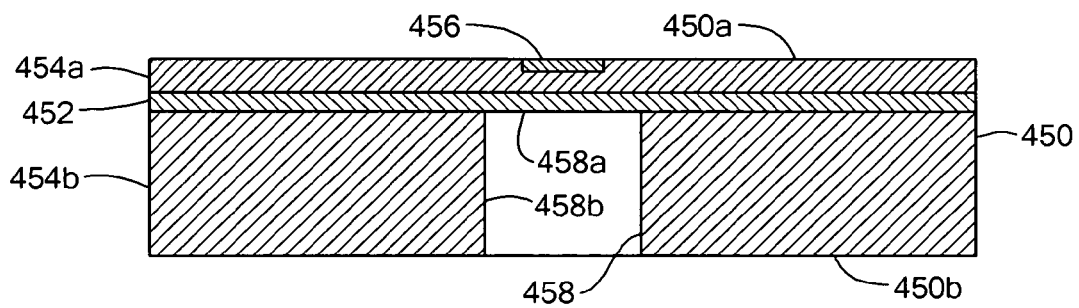
Figure 4B:
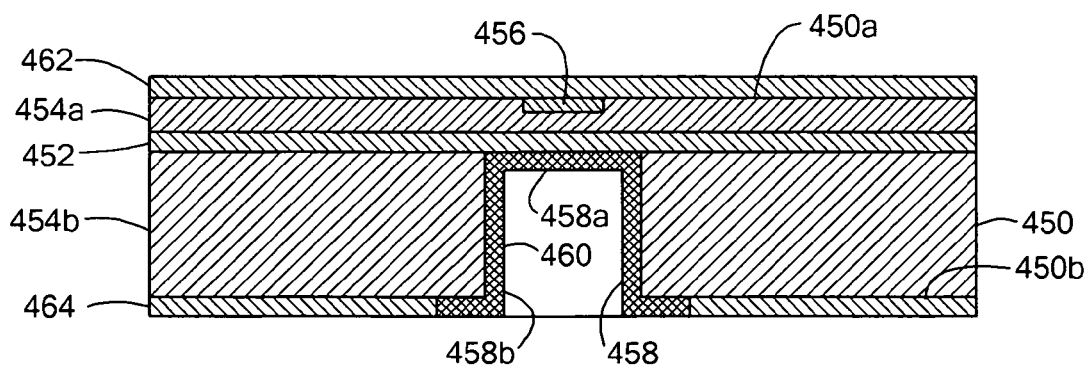
Figure 4C:
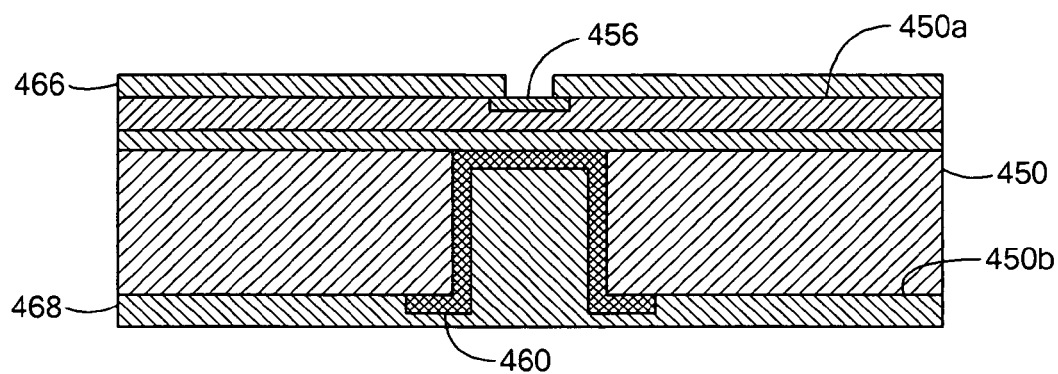
Figure 4D:
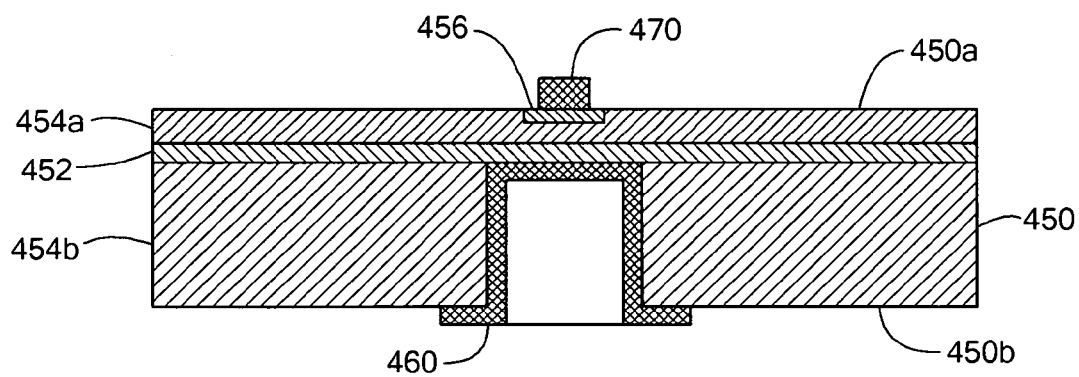

FIGS. 4-4D show block diagrams of a process to provide a substrate having a depression, for example, the substrate 26 having the depression 24 (with the soft magnetic material layer 21) and the surface magnetic flux concentrator 52 of FIG. 1A. In FIGS. 4-4D, like elements are shown having like reference designations.

Referring now to FIG. 4, a silicon on oxide (SOI) substrate 450, has first and second opposing surface 450a, 450b, respectively, and has an oxide layer 452 between first and second silicon layers 454a, 454b, respectively. The substrate 450 is pre-processed to include a magnetic field sensing element 456, for example, a Hall element. In some other embodiments, the substrate is a silicon substrate having no oxide layer 452. However, the substrate 450 is not limited to a silicon substrate or an SOI substrate.

Referring now to FIG. 4A, the substrate 450 is etched to provide a depression 458 having a first surface 458a and a second surface 458b. In one embodiment the depression is formed with a deep-reactive ion etch (DRIE). In another embodiment, the depression 458 is formed with a potassium hydroxide (KOH) or other anisotropic etchant. However, other etching processes can also be used. In some embodiments, the depression can be formed up to the oxide layer 452. However, in other embodiments, for example, embodiments for which there is no oxide layer 452, the depression can be formed to any depth in the substrate 450, but not touching the magnetic field sensing element 456. Using an SOI wafer has the advantage that the etch depth can be accurately controlled in relation to the magnetic field sensing element 456 allowing for the effects of non-uniform etching across the wafer to be minimized since the etch rate of the oxide layer 452 is typically significantly slower than the etch rate of the silicon layer 454b, which allows the wafer to be over-etched without breaking through the oxide and potentially damaging the magnetic field sensing element 20.

The depression 458 is formed having the first surface 458a of the depression 458 generally parallel to the first surface 450a of the substrate 450. In some embodiments, the depression 458 is formed having the second surface 458b of the depression 458 generally perpendicular to the first surface 458a of the depression 458. However, in other embodiments, the second surface 458b can be at other angles relative to the first surface 458a of the substrate 450.

Referring now to FIG. 4B, a first seed layer 464 is deposited on the substrate 450. The first seed layer 464 can be comprised of, but is not limited to, a titanium adhesion layer with a copper seed layer or a titanium adhesion layer with a gold seed layer. A first photoresist layer 462 may also be deposited on the substrate 450 to protect the first surface 450a of the substrate 450 during processing. The first seed layer 464 is patterned with an electroplating mold (not shown), which can include, but is not limited to, photoresist, photosensitive polyimide, and a photosensitive BCB, using a photolithography process. A soft magnetic material layer 460 is then deposited on at least one of the first surface 458a and the second surface 458b of the depression 458. The soft magnetic material layer 458 can be formed from a soft magnetic material including, but not limited to, Permalloy, NiFeMo, Supermalloy, a Nickel alloy, an Iron alloy, a Cobalt alloy, and/or a Manganese alloy. The soft magnetic material layer 458 can be formed by an electroplating process or by an etching process.

Referring now to FIG. 4C, the front side photoresist layer 462 and the above-described electroplating mold and first seed layer 464 are removed. A second photoresist layer 468 is deposited on the surface 450b of the substrate 450. A second seed layer (not shown), which can be comprised of the same material as the first seed layer 464 is deposited on the first surface 450a of the substrate 450. The second seed layer (not shown) is patterned with an electroplating mold 466, which can include but is not limited to photoresist, photosensitive polyimide, or a photosensitive BCB, using a photolithography process. It is also possible to use other materials that are not photosensitive and then etch those materials after patterning to create a plating mold.

Referring now to FIG. 4D, a surface magnetic flux concentrator 470 can be deposited on the first surface 450a of the substrate 450 proximate to the magnetic field sensing element 456. The second photoresist layer 468 and the second seed layer 466 can be removed. In some embodiments it may be desirable to leave the plating mold (for example, if SU-8 is used) and the seed layer in place. Such embodiments are acceptable, provided the second seed layer 466 does not cause an electrical short in the sensor. The surface magnetic flux concentrator 470 can be formed from a soft magnetic material including, but not limited to, a ferrite material, Permalloy, NiFeMo, Supermalloy, a Nickel alloy, an Iron alloy, a Cobalt alloy, and/or a Manganese alloy.

It will be appreciated that, in other arrangements, for example, the apparatus 10 of FIG. 1, the surface magnetic flux concentrator 470 is omitted.

In other embodiments, instead of using an electroplating process, a lift-off or deposition and etch process could be utilized to form the areas of soft magnetic material. These processes are described, for example, in conjunction with FIGS. 5-5D below.

Figure 5:
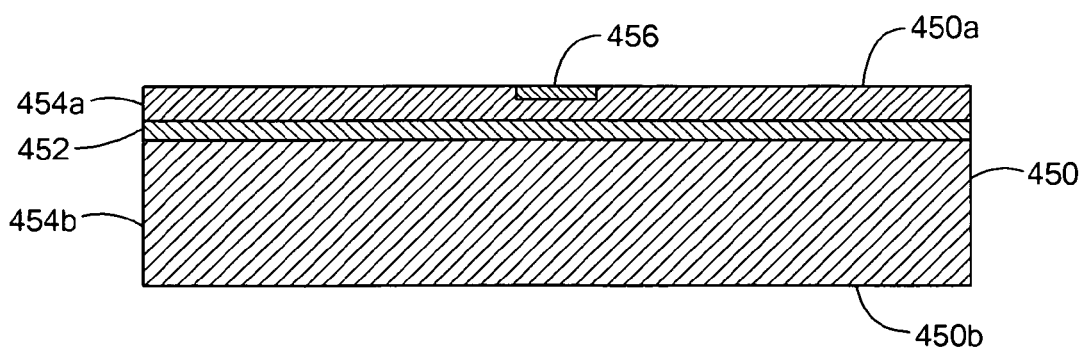
FIGS. 5-5D are block diagrams showing a sequence of fabrication steps to fabricate the apparatus of FIGS. 1B and 3C.
Figure 5A:
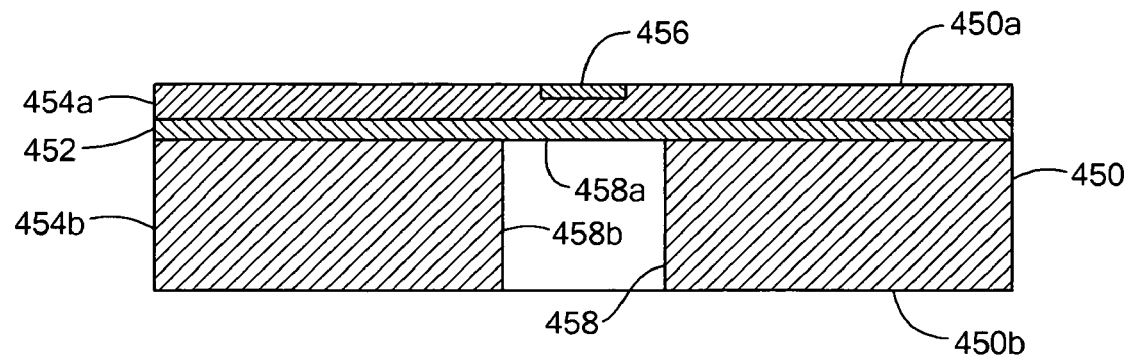
Figure 5B:
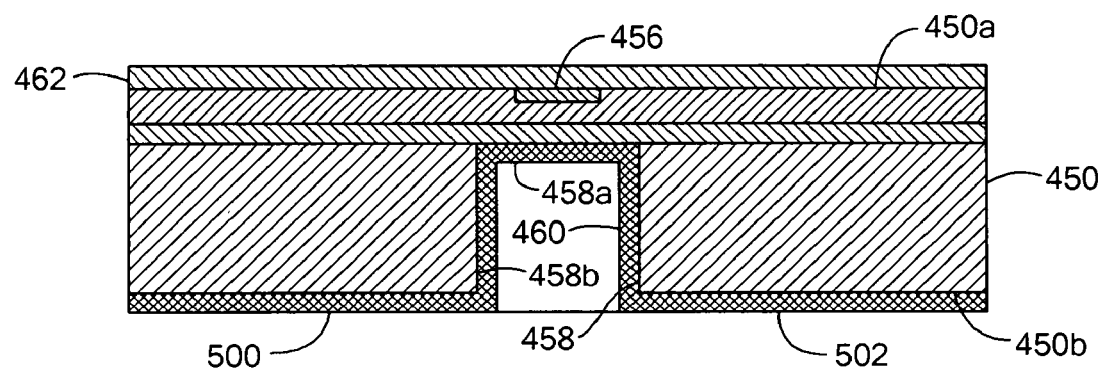
Figure 5C:
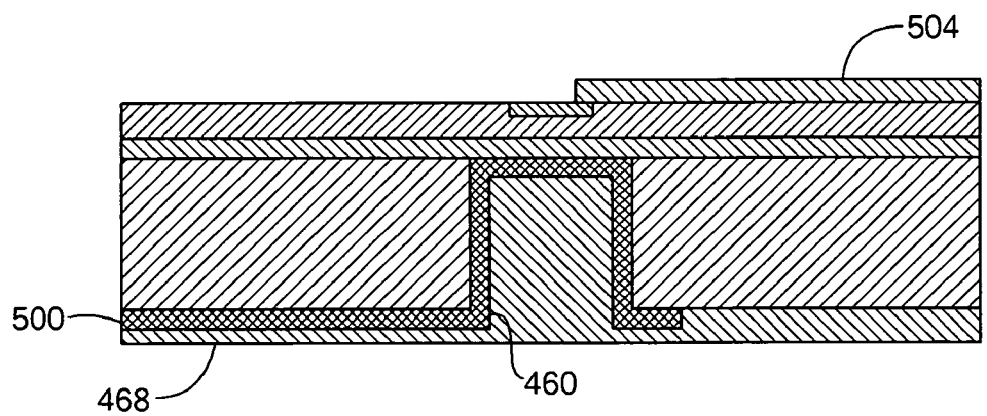
Figure 5D:
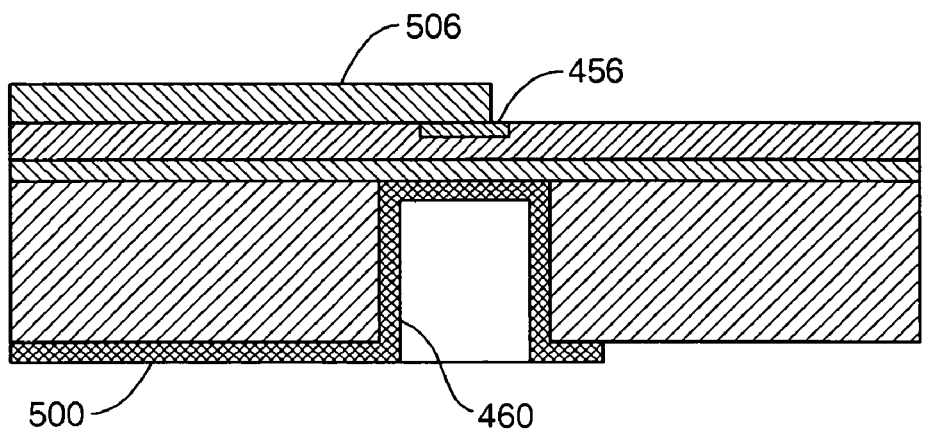

FIGS. 5-5D show block diagrams of a process to provide a substrate having a depression, for example, the substrate 26 having the depression 24 (with the soft magnetic material layer 21), and having the first and second magnetic material layer extensions 102, 106, respectively of FIG. 1C. In FIGS. 5-5D, like elements are shown having like reference designations. Also, like elements of FIGS. 4-4D are shown having like reference designations.

FIGS. 5 and 5A show the same processes as FIGS. 4 and 4A and are not discussed again.

Referring now to FIG. 5B, a soft magnetic material layer 502 is deposited on the substrate 450 using a process such as sputtering, or evaporation. In another embodiment, the soft magnetic material layer 502 is formed by plating and etching. The first photoresist layer 462 is also deposited on the substrate 450. The soft magnetic material layer 502 is patterned with an etching process to leave the soft magnetic material 502 in the depression 458 and also in a region associated with a soft magnetic material layer extension 500. The soft magnetic material layer 460 and the soft magnetic material layer extension 500 may be formed from a soft magnetic material including, but not limited to, a ferrite material, Permalloy, NiFeMo, Supermalloy, a Nickel alloy, an Iron alloy, a Cobalt alloy, and/or a Manganese alloy.

Referring now to FIG. 5C, a second seed layer (not shown), can be comprised of, but is not limited to, a titanium adhesion layer with a copper seed layer, and a titanium adhesion layer with a gold seed layer. The second seed layer is patterned with a plating mold 504, forming the second seed layer (not shown) on the first surface 450a of the substrate 450 everywhere except in a region associated with a soft magnetic material layer extension 506 (FIG. 5D, yet to be formed.) Referring now to FIG. 5D, the soft magnetic material layer extension 506 can be deposited on the first surface 450a of the substrate 450, having at least one end proximate to the magnetic field sensing element 456. The second seed layer and the plating mold 504 can be removed. The soft magnetic material layer extension 506 can be formed from a soft magnetic material including but not limited to, Permalloy, NiFeMo, Supermalloy, a Nickel alloy, an Iron alloy, a Cobalt alloy, and/or a Manganese alloy.

Figure 6:
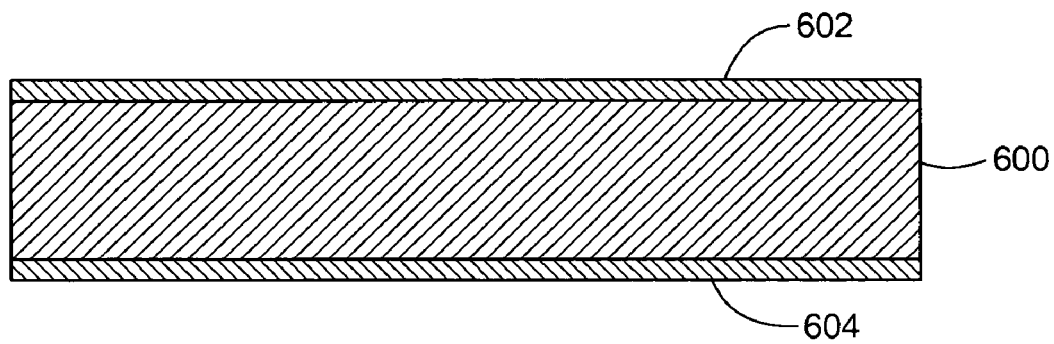
FIGS. 6-6C are block diagrams showing a sequence of fabrication steps to fabricate a portion of the apparatus of FIGS. 2-2A, 3A, and 3B.
Figure 6A:
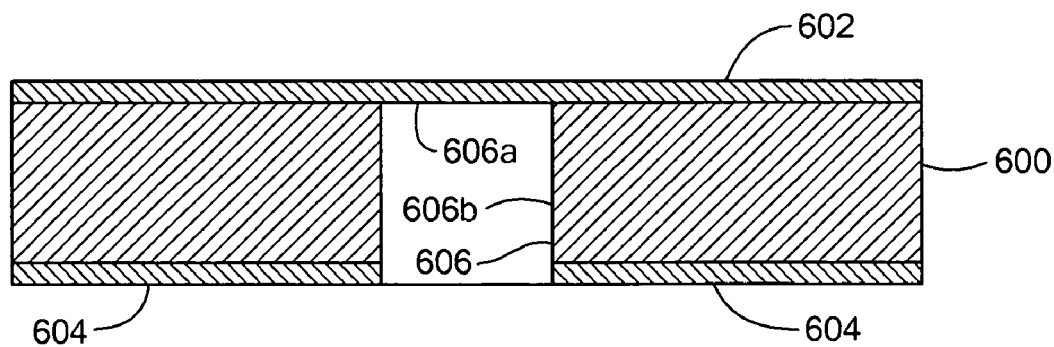
Figure 6B:
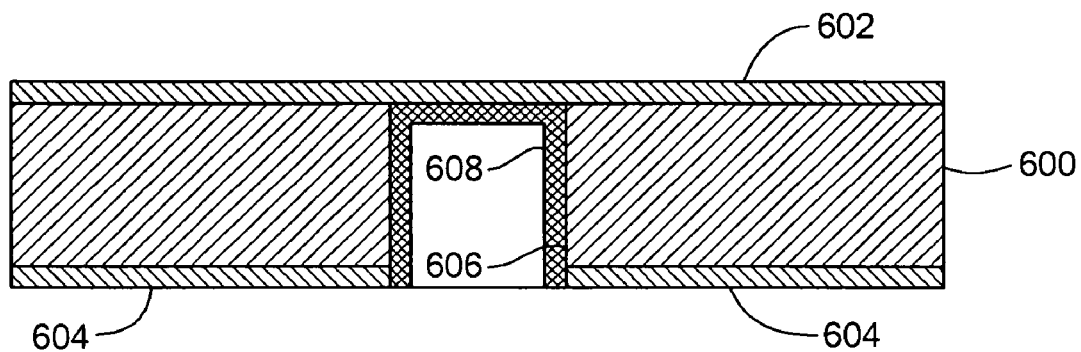
Figure 6C:
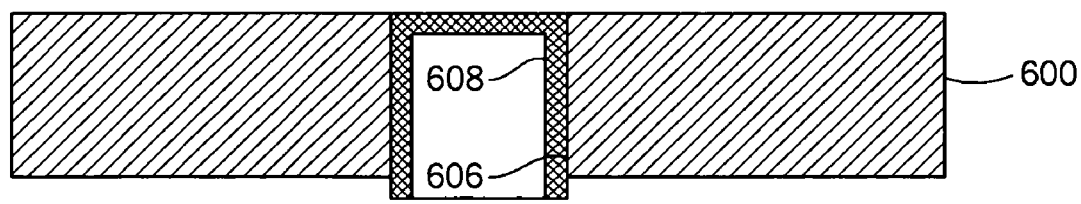

FIGS. 6-6C show block diagrams of a process to provide a concentrator apparatus having a depression, for example, the concentrator apparatus 202 having the depression 204

(with the soft magnetic material layer 201) of FIG. 2. In FIGS. 6-6C, like elements are shown having like reference designations.

Referring now to FIG. 6, a substrate 600 has insulating layers 602, 604. The insulating layers can be comprised of, for example, silicon dioxide or silicon nitride. It may also be desirable to coat one or both sides of the substrate 600 with a polymer dielectric material (not shown).

Referring now to FIG. 6A, the insulating layer 604 is coated with a photoresist material (not shown), the photoresist material is patterned, and the insulating layer 604 is etched from the open pattern. A DRIE (deep reactive ion etch) is then used to etch a depression 606, having first and second surfaces, 606a, 606b, respectively. The photoresist material is then removed.

Referring now to FIG. 6B, a seed layer (not shown) is deposited over the insulating layer 604. The seed layer is patterned and a soft magnetic material layer 608 is deposited on at least one of the first surface 606a and the second surface 606b of the depression 606. The soft magnetic material layer 608 can be formed from a soft magnetic material including, but not limited to, a ferrite material, Permalloy, NiFeMo, Supermalloy, a Nickel alloy, an Iron alloy, a Cobalt alloy, and/or a Manganese alloy.

It should be appreciated, that in some embodiments, an electroplated photoresist might be preferable to a typical photoresist due to the non-planarity of the substrate and the DRIE depression. A typical photoresist may tend to collect in the DRIE depression and not develop out of the depression as desired during the photolithography steps. Another method to expose the depression uses a negative photoresist, or other photo definable material, which is polymerized where exposed, and therefore, the unexposed polyimide in the depression would be removed during the development.

Referring now to FIG. 6C, the insulating layers 602, 604 can be removed. It should be appreciated that removing the insulating layers 602, 604 is optional, and in certain applications may be undesirable since the silicon would be exposed, possibly resulting in a short circuit between adjacent bonding wires when packaged. Polymer dielectric materials may be used in conjunction with or instead of the above-described inorganic nitride and oxide materials. When used, the polymer material would provide additional support for the soft magnetic material layer 608.

It would also be appreciated that the soft magnetic material layer 608 could be deposited across the surface 604 of the substrate 600 by a process such as electroplating, sputtering, or evaporation and then patterned with photolithography and etched to remove the material from the areas it is not desired.

In some embodiments, the depression 606 (e.g., 606, FIG. 6A) is a through hole, and thus, has only the second surface 606b. In these embodiments, the soft magnetic material layer 606 is deposited only on the second surface 606b of the depression 606, forming an open or closed cylinder of soft magnetic material.

In other embodiments, the depression 606 is etched to a shallower depth in the substrate 600, resulting in a less fragile soft magnetic material layer 606.

In other embodiments the depression sidewalls 606b could be coated with a dielectric prior to the deposition of the soft magnetic material 608.

Figure 7:
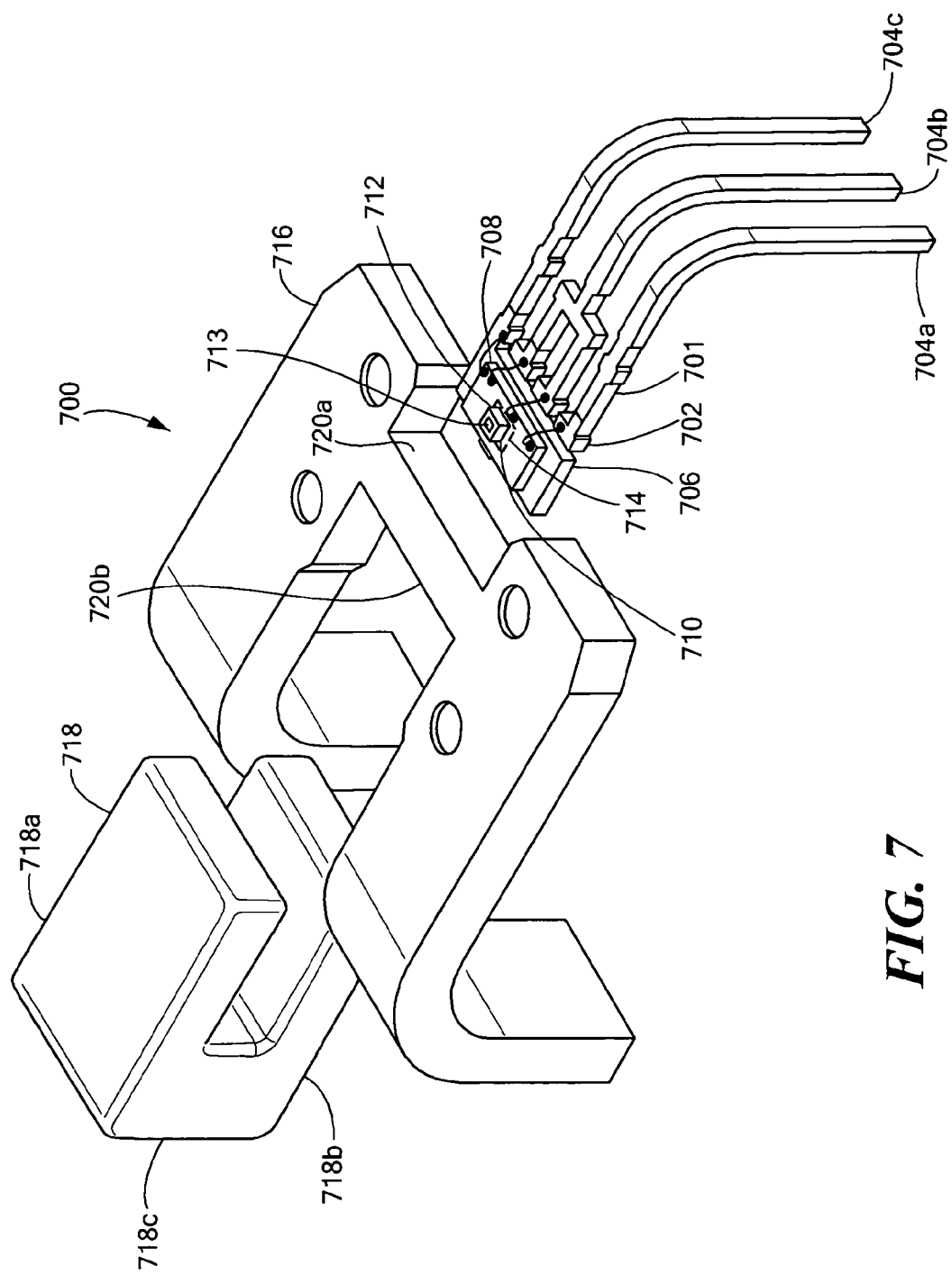
FIG. 7 is an exploded perspective drawing of an electronic assembly having an integrated circuit and having a concentrator apparatus as in FIG. 2A.

Referring now to FIG. 7, an electronic assembly 700 includes an integrated circuit 701 having a substrate 708, which is coupled to a lead frame 702 having leads 704a-704c and a base plate 706. The electronic assembly 700 also includes a concentrator apparatus 710 having a concentrator apparatus substrate 712 with a depression 713 formed therein in accordance with the process of FIGS. 6-6C, and a soft magnetic material layer (not shown) disposed in the depression 713, also in accordance with the process of FIGS. 6-6C. A magnetic field sensor 714 is disposed under the concentrator apparatus 710.

The electronic assembly 700 can also have a flux concentrator 718 and a current carrying conductor 716, which, when assembled, are disposed proximate the integrated circuit 701. The current carrying conductor 716 can have at least one of a first notch 720a and a second notch 720b, which is substantially aligned with the first notch. When assembled, at least a portion of the integrated circuit 701 is disposed in the first notch 720a.

The flux concentrator 718 can be substantially C-shaped, having a central region 718c and a pair of substantially parallel legs 718a, 718b extending from the central region 718c. When assembled, at least a portion of the central region 718c is disposed in the second notch 720b of the current carrying conductor 716 such that each leg 718a, 718b covers at least a portion of a respective surface of the integrated circuit 701 and concentrator 710.

The first notch 720a is formed to substantially surround and to be in near contact with the integrated circuit 701, providing an alignment of the integrated circuit 701 relative to the current carrying conductor 716. Similarly, the second notch 720b is formed to substantially surround and to be in near contact with the central region 718c of the flux concentrator 718, providing an alignment of the flux concentrator 718 relative to the current carrying conductor 716.

It will be appreciated that the substrate 708, the magnetic field sensing element 714, and the concentrator apparatus 710 can be the same as or similar to the substrate 26, the magnetic field sensing element 20, and the concentrator apparatus 202 of FIG. 2A.

In some embodiments, the electronic assembly 700 can correspond to a current sensor responsive to a magnetic field associated with an electrical current though the current carrying conductor 716. In operation, as current passes through the current carrying conductor 716, a magnetic field is established in the flux concentrator 718. An effective magnetic gap of the magnetic circuit is the distance between the legs 718a, 718b of the flux concentrator 718. However, if the concentrator apparatus 710 is positioned over the magnetic field sensor 714, the effective magnetic gap is reduced by the height of the soft magnetic material layer (not shown) in the depression 713. Thus the magnetic sensitivity is increased by the presence of the concentrator apparatus 710.

In other embodiments, the current carrying conductor 716 and the flux concentrator 718 are omitted and the integrated circuit 701 can correspond to a proximity sensor responsive to a magnetic field associated with at least one of a ferrous or hard magnetic material object and a soft magnetic material object, for example, a gear tooth. In yet another embodiment, the current carrying conductor 716 and the flux concentrator 718 are omitted and the integrated circuit 701 can correspond to a magnetic field sensor responsive to a magnetic field external to the integrated circuit 701.

Figure 8:
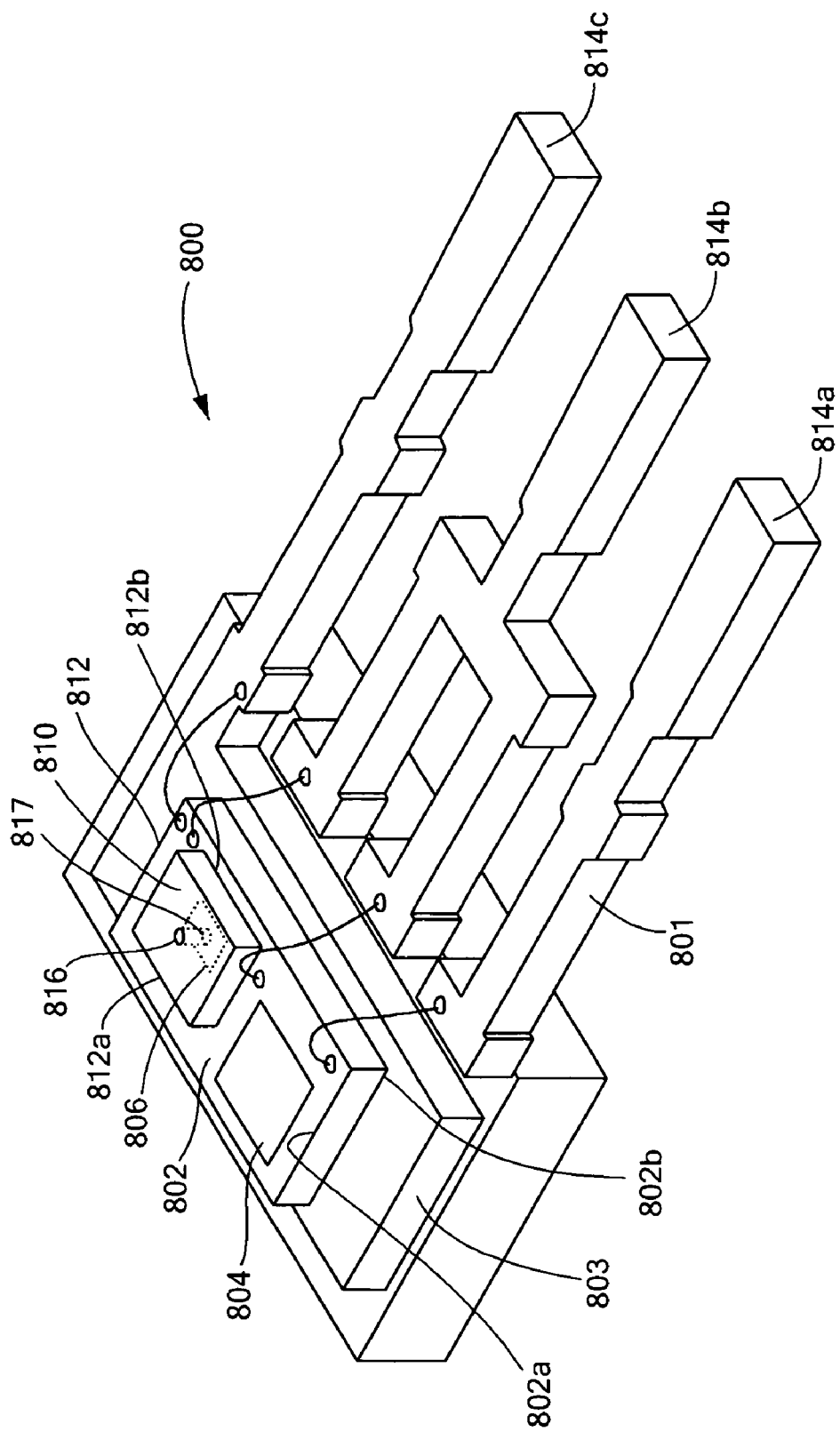
FIG. 8 is a perspective drawing showing further details of the integrated circuit and concentrator apparatus of FIG. 7.

Referring now to FIG. 8, an integrated circuit 800 includes a substrate 802 having first and second opposing surfaces 802a, 802b, respectively. A lead frame 801 has leads 814a-814c and a base plate 803. The substrate 802 includes a region 804 having integrated circuits disposed thereupon and also includes a magnetic field sensing element 806. The integrated circuit 800 also includes a concentrator apparatus 810 having a concentrator apparatus substrate 812 with first and second concentrator apparatus substrate surfaces 812a, 812b, respectively. A depression 816 is formed in the first surface 812a of the concentrator apparatus substrate 812 and a soft magnetic material layer 817 is disposed therein.

It will be appreciated that the substrate 802, the magnetic field sensing element 806, and the concentrator apparatus 810 can be the same as or similar to the substrate 26, the magnetic field sensing element 20, and the concentrator apparatus 202 of FIG. 2A. It will also be appreciated that the substrate 802, the magnetic field sensing element 806, and the concentrator apparatus 810 can be the same as or similar to the substrate 708, the magnetic field sensing element 714, and the concentrator apparatus 710 of FIG. 7.

In some embodiments, the integrated circuit 800 can correspond to a current sensor responsive to responsive to a magnetic field associated with an electrical current though a current carrying conductor (not shown). In other embodiments, the integrated circuit 800 can correspond to a proximity sensor responsive to a magnetic field associated with at least one of a ferrous object and a soft magnetic material object, for example, a gear tooth. In yet another embodiment, the integrated circuit 800 can correspond to a magnetic field sensor responsive to a magnetic field external to the integrated circuit 800.

Figure 9:
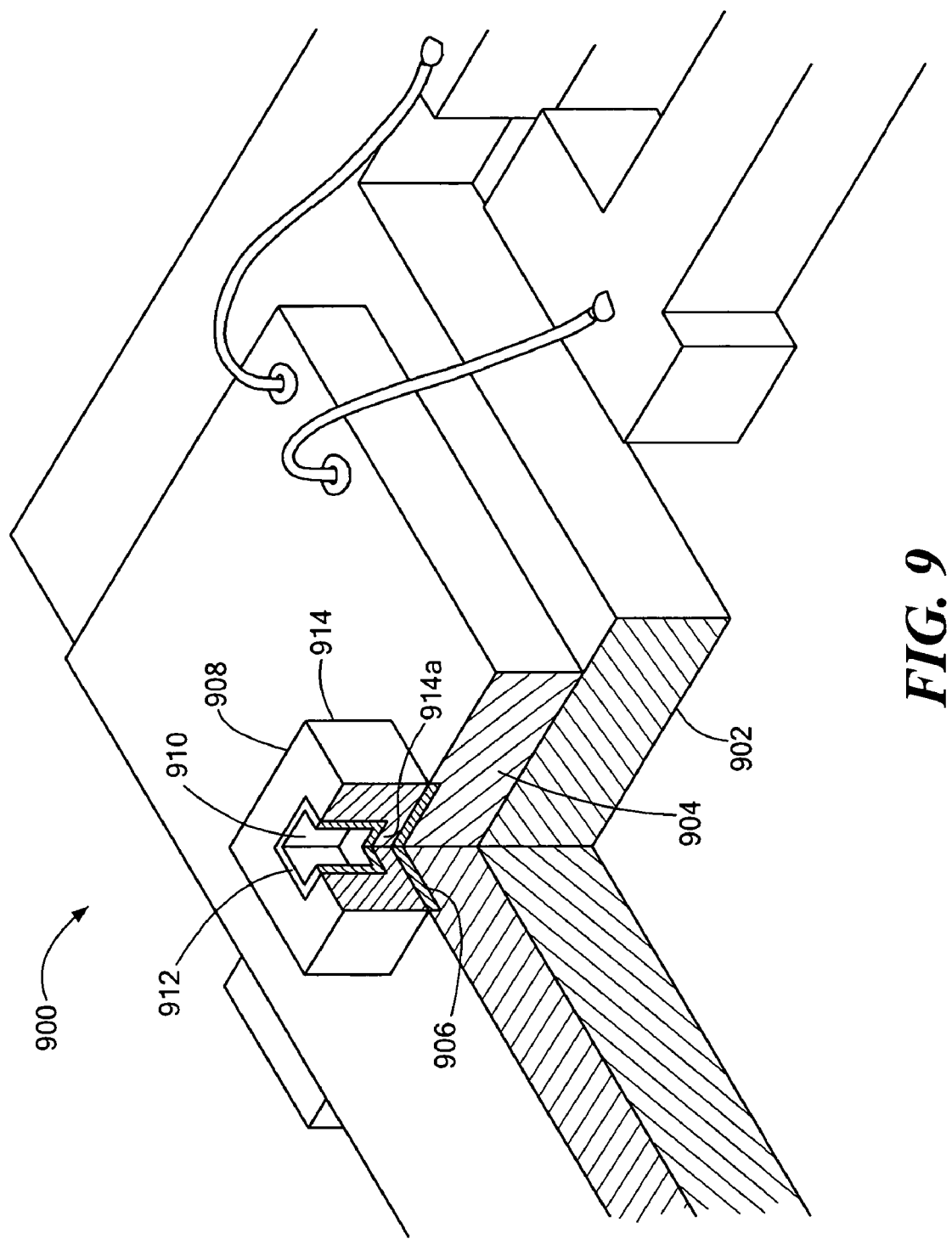
FIG. 9 is a perspective drawing showing further details of the integrated circuit and concentrator apparatus of FIG. 8.

Referring now to FIG. 9, an integrated circuit 900 includes a lead frame base plate 902 and a substrate 904 having a magnetic field sensing element 906 disposed thereon. A concentrator apparatus 908 includes a concentrator apparatus substrate 914 having a depression 910 with a soft magnetic material layer 912 disposed therein. The concentrator apparatus 908 can be formed, for example, by the process of FIGS. 6-6C. A region 914a of the concentrator apparatus substrate 914 remains after fabrication of the concentrator apparatus 908. The region 914a provides additional strength to the soft magnetic material layer 912. It should be noted that the bottom of the depression 910 is shown as being smaller than the magnetic field sensing element 906, however, in other embodiments, the bottom of the depression 910 may be the same size or larger than the magnetic field sensing element 906. In an embodiment in which the depression 910 is larger than the magnetic field sensing element 906 it will be apparent that the magnetic flux is concentrated less than in an embodiment having a depression 910 smaller than the magnetic field sensing element 906, which may be useful for some applications where a slightly lower magnetic sensitivity is desired.

It will be appreciated that the substrate 904, the magnetic field sensing element 906, and the concentrator apparatus 908 can be the same as or similar to the substrate 26, the magnetic field sensing element 20, and the concentrator apparatus 202 of FIG. 2A. It will also be appreciated that the substrate 904, the magnetic field sensing element 906, and the concentrator apparatus 908 can be the same as or similar to the substrate 708, the magnetic field sensing element 714, and the concentrator apparatus 710 of FIG. 7.

Figure 10:
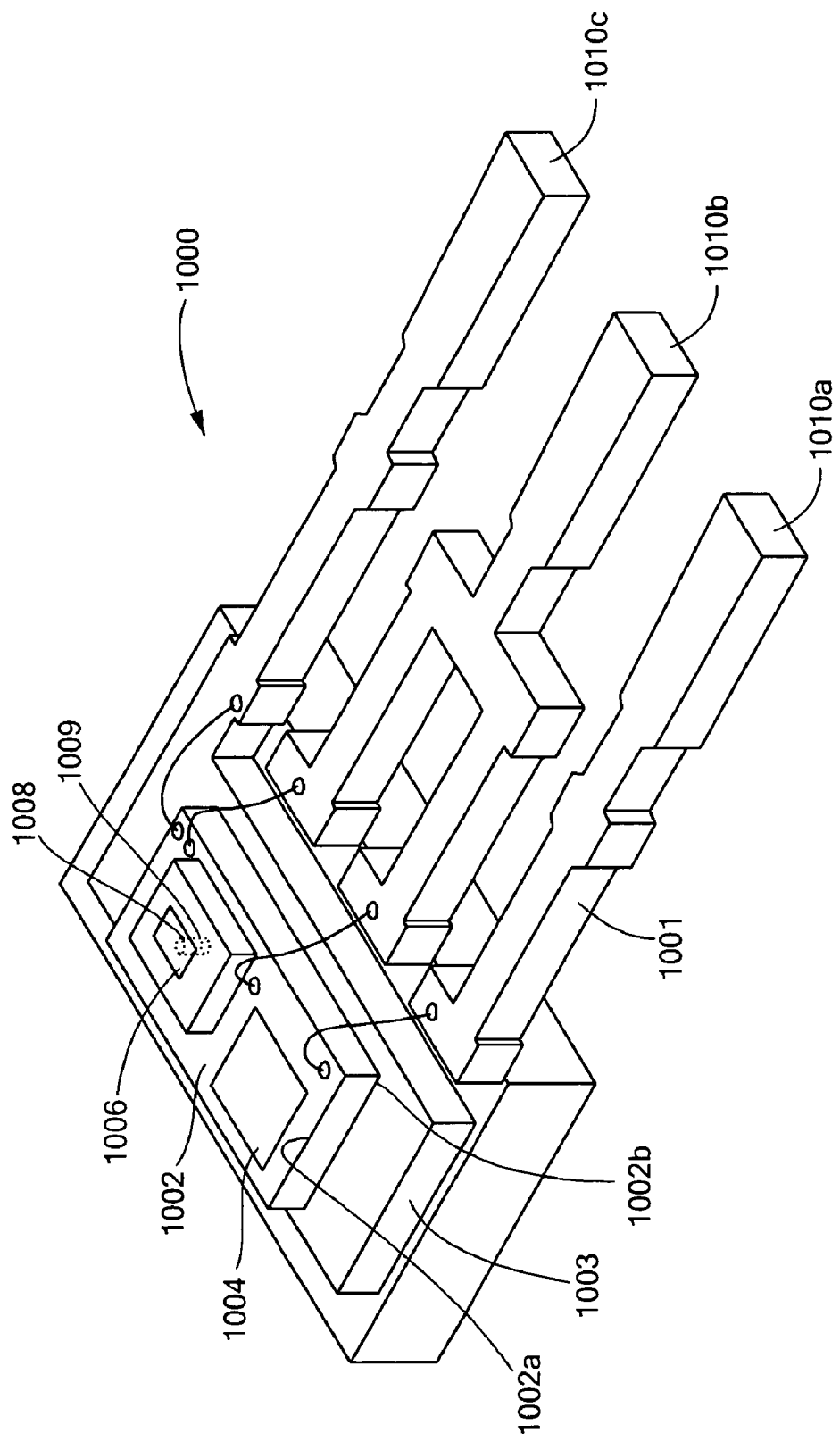
FIG. 10 is a perspective drawing showing an alternate arrangement associated with the integrated circuit of FIG. 7.

Referring now to FIG. 10, an integrated circuit 1000 includes a substrate 1002 having first and second opposing surfaces 1002a, 1002b, respectively. A lead frame 1001 has leads 1010a-1010c and a base plate 1003. The substrate 1002 includes a region 1004 having integrated circuits disposed thereupon and also includes a magnetic field sensing element 1006. A depression 1008 is formed in the second surface 1002b of the substrate 1002 and a soft magnetic material layer 1009 is disposed therein.

It will be appreciated that the substrate 1002, magnetic field sensing element 1006, and depression 1008 can be the same as or similar to the substrate 26, the magnetic field sensing element 20, and the depression 24 of FIG. 1. The integrated circuit 1000 can be used in place of the integrated circuit 701 of FIG. 7.

In some embodiments, the integrated circuit 1000 can correspond to a current sensor responsive to responsive to a magnetic field associated with an electrical current though a current carrying conductor (not shown). In other embodiments, the integrated circuit 1000 can correspond to a proximity sensor responsive to a magnetic field associated with at least one of a ferrous object and a soft magnetic material object, for example, a gear tooth. In yet another embodiment, the integrated circuit 1000 can correspond to a magnetic field sensor responsive to a magnetic field external to the integrated circuit 1000.

Referring now to FIG. 11, an exemplary current sensor 1110 in accordance with the present invention includes a lead frame 1112 having a plurality of leads 1112a-1112h. The leads 1112a and 1112b are coupled to the leads 1112c and 1112d to form a current path, or current conductor with a narrow portion 1114 having a width w1. The current sensor 1110 also includes a substrate 1116 having a first surface 1116a and a second, opposing surface 1116b. The substrate 1116 has a magnetic field sensing element 1118 which, in some embodiments, can be a Hall effect element 1118, diffused into the first surface 1116a, or otherwise disposed on the first surface 1116a. The substrate 1116 can be comprised of a semiconductor material, e.g., silicon, or, in an alternate embodiment, the substrate 1116 can be comprised of an insulating material.

The substrate 1116 is disposed above the lead frame 1112 so that the first surface 1116a is proximate to the current conductor portion 1114 and the second surface 1116b is distal from the current conductor portion 1114 and more specifically, so that the Hall effect element 1118 is in close proximity to the current conductor portion 1114. In the illustrated embodiment, the substrate 1116 has an orientation that is upside down (i.e., the first surface 1116a is directed downward) relative to a conventional orientation with which a substrate is mounted in an integrated circuit package.

A depression 1150 is formed in the second surface 1116b of the substrate. A soft magnetic material layer 1152 is deposited in the depression 1150 according to the processes described in conjunction with FIGS. 4-4D. A magnetic material extension (not shown), similar to the soft magnetic material layer extension 54 of FIG. 3C, can be formed on the second surface 1116b. As described above, for example, in conjunction with FIG. 3C, in operation, the soft magnetic material layer 1152 tends to concentrate a magnetic flux in the vicinity of the magnetic field sensing element 1118, resulting in an increased sensitivity.

The substrate 1116 has bonding pads 1120a-1120c on the first surface 1116a, to which bond wires 1122a-122c are coupled. The bond wires are further coupled to the leads 1112e, 1112f, 1112h of the lead frame 1112.

An insulator 1124 separates the substrate 1116 from the lead frame 1112. The insulator 1124 can be provided in a variety of ways. For example, in one embodiment, a first portion of the insulator 1124 includes a four μm thick layer of a BCB resin material deposited directly on the first surface 1116a of the substrate 1116. A second portion of the insulator 1124 includes a layer of Staychip™ NUF-2071 E underfill material (Cookson Electronics Equipment, New Jersey) deposited on the lead frame 1112. Such an arrangement provides more than one thousand volts of isolation between the substrate 1116 and the lead frame 1112.

It will be understood that the current conductor portion 1114 is but a part of the total path through which an electrical current flows. For example, a current having a direction depicted by arrows 1126 flows into the leads 1112*c*, 1112*d*, which are here shown to be electrically coupled in parallel, through the current conductor portion 1114, and out of the leads 1112*a*, 1112*b*, which are also shown here to be electrically coupled in parallel.

With this arrangement, the Hall effect element 1118 is disposed in close proximity to the current conductor portion 1114 and at a predetermined position relative to the conductor portion 1114, such that a magnetic field generated by an electrical current passing though the current conductor portion 1114, in a direction shown by arrows 1126, is in a direction substantially aligned with a maximum response axis of the Hall effect element 1118. The Hall effect element 1118 generates a voltage output proportional to the magnetic field and therefore proportional to the current flowing through the current conductor portion 1114. The illustrated Hall effect element 1118 has a maximum response axis substantially aligned with a z-axis 1134. Because the magnetic field generated in response to the current is circular about the current conductor portion 1114, the Hall effect element 1118 is disposed just to the side (i.e., slightly offset along a y-axis 1132) of the current conductor portion 1114, as shown, where the magnetic field is pointed substantially along the z-axis 1134. This position results in a greater voltage output from the Hall effect element 1118, and therefore improved sensitivity. However, a Hall effect element, or another type of magnetic field sensor, for example a magnetoresistance element, having maximum response axis aligned in another direction, can be disposed at another position relative to the current conductor portion 1114, for example, on top of the current conductor portion 1114 (in a direction along z-axis 1134).

While one Hall effect element 1118 is shown on the first surface 16*a* of the substrate 16, it will be appreciated that more than one Hall effect element can be used. Also, additional circuitry, for example an amplifier, can also be diffused in or otherwise disposed on, or supported by the first and/or second surfaces 1116*a*, 1116*b* of the substrate 1116.

In the embodiment of FIG. 11, the close proximity between the Hall effect element 1118 and the current conductor 1114 is achieved by providing the Hall effect element 1118 on the first substrate surface 1116*a*, which is positioned closer to the current conductor portion 1114 than the second surface 1116*b*. In other embodiments, this advantageous close proximity is achieved by providing the Hall effect element 1118 on the second substrate surface 1116*b* and forming the current conductor portion 1114 so as to be in substantial alignment with the second surface 1116*b*.

While wire bonds 1122*a*-1122*c* are shown, other connection methods can also be used, including but not limited to, solder balls, gold bumps, eutectic and high lead solder bumps, no-lead solder bumps, gold stud bumps, polymeric conductive bumps, anisotropic conductive paste, and conductive film.

While various soft magnetic material layers are described above, for example, the soft magnetic material layer 21 of FIG. 1, in some embodiments, hard magnetic material layers can be used in place of the above-described soft magnetic material layers. Such arrangements can be useful, for example, to detect rotation of a gear comprised of a relative soft magnetic material.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. Apparatus, comprising:
a substrate having first and second opposing surfaces;
a magnetic field sensing element disposed on the first surface of the substrate, having first and second opposing magnetic field sensing element surfaces generally parallel to the first surface of the substrate;
a depression disposed in the second surface of the substrate and generally aligned with the magnetic field sensing element, wherein the depression has a first depression surface generally parallel to the first surface of the substrate and adjacent to the magnetic field sensing element and a second depression surface adjacent to the first depression surface; and
a magnetic material layer disposed on at least one of the first depression surface or the second depression surface.

2. The apparatus of claim 1, wherein the magnetic material layer is comprised of a soft magnetic material.

3. The apparatus of claim 1, wherein the magnetic material layer is comprised of a hard magnetic material.

4. The apparatus of claim 1, wherein the second depression surface is generally perpendicular to the first depression surface.

5. The apparatus of claim 1, wherein the magnetic material layer is formed from a selected one of a ferrite material, Permalloy, NiFeMo, Supermalloy, a Nickel alloy, an Iron alloy, a Cobalt alloy, or a Manganese alloy.

6. The apparatus of claim 1, wherein the magnetic material layer is disposed with a selected one of a plating process, a sputtering process, or an electron beam process.

7. The apparatus of claim 1, further comprising a soft magnetic material layer extension disposed on the second surface of the substrate.

8. The apparatus of claim 7, wherein the soft magnetic material layer extension is disposed with a selected one of a plating process, a sputtering process, or an electron beam process.

9. The apparatus of claim 1, wherein the depression is a deep reactive ion etch (DRIE) depression.

10. The apparatus of claim 1, further comprising a second magnetic material layer disposed on the first surface of the magnetic field sensing element surface.

11. The apparatus of claim 10, wherein the second magnetic material layer is comprised of a soft magnetic material.

12. The apparatus of claim 10, wherein the second magnetic material layer is comprised of a hard magnetic material.

13. The apparatus of claim 10, further comprising at least one of: a first soft magnetic material layer extension disposed on the first surface of the substrate or a second soft magnetic material layer extension disposed on the second surface of the substrate.

14. The apparatus of claim 13, wherein the first soft magnetic material layer extension and the second soft magnetic material layer extension are disposed with a selected one of a plating process, a sputtering process, or an electron beam process.

15. The apparatus of claim 10, wherein the magnetic material layer is formed from a selected one of a ferrite material, Permalloy, NiFeMo, Supermalloy, a Nickel alloy, an Iron alloy, a Cobalt alloy, or a Manganese alloy.

16. The apparatus of claim 10, wherein the second magnetic material layer is disposed with a selected one of a plating process, a sputtering process or an electron beam process.

17. The apparatus of claim 1, wherein the magnetic field sensing element is responsive to a magnetic field associated with an electrical current.

18. The apparatus of claim 1, wherein the magnetic field sensing element is responsive to a magnetic field external to the apparatus.

19. The apparatus of claim 1, wherein the magnetic field sensing element is responsive to a magnetic field associated with at least one of a hard magnetic material object or a soft magnetic material object.

20. The apparatus of claim 1, further including a concentrator apparatus, comprising:
  a second substrate having first and second opposing surfaces, wherein the second surface of the second substrate is disposed over a selected one of the first surface of the substrate or the second surface of the substrate and the first surface of the second substrate is disposed over the second surface of the second substrate;
  a concentrator apparatus depression disposed in at least one of the first surface or the second surface of the second substrate and generally aligned with the magnetic field sensing element, wherein the concentrator apparatus depression has at least one of a first concentrator apparatus depression surface generally parallel to the second surface of the second substrate and a second concentrator apparatus depression surface; and
  a concentrator apparatus magnetic material layer disposed on at least one of the first concentrator apparatus depression surface or the second concentrator apparatus depression surface.

21. The apparatus of claim 20, wherein the concentrator apparatus magnetic material layer is comprised of a soft magnetic material.

22. The apparatus of claim 20, wherein the concentrator apparatus magnetic material layer is comprised of a hard magnetic material.

23. The apparatus of claim 20, wherein the concentrator apparatus magnetic material layer is formed from a selected one of a ferrite material, Permalloy, NiFeMo, Supermalloy, a Nickel alloy, an Iron alloy, a Cobalt alloy, or a Manganese alloy.

24. The apparatus of claim 20, wherein the concentrator apparatus magnetic material layer is disposed with a selected one of a plating process, a sputtering process, or an electron beam process.

25. The apparatus of claim 20, wherein the concentrator apparatus depression is a deep reactive ion etch (DRIE) concentrator apparatus depression.

26. The apparatus of claim 20, further including:
  a conductor having a first notch and a second notch substantially aligned with the first notch, wherein the magnetic field sensing element has at least a portion disposed in the first notch; and
  a magnetic core having a central region and a pair of substantially parallel legs extending from said central region, wherein at least a portion of said central region is disposed in the second notch and wherein at least a portion of each leg covers at least a portion of a respective surface of the magnetic field sensing element.

27. The apparatus of claim 20, further including:
  a lead frame having a plurality of leads;
  a current conductor portion comprising a coupling of at least two of the plurality of leads, wherein the current conductor portion is disposed proximate the first surface of the substrate.

28. The apparatus of claim 1, further including:
  a conductor having a first notch and a second notch substantially aligned with the first notch, wherein the magnetic field sensing element has at least a portion disposed in the first notch; and
  a magnetic core having a central region and a pair of substantially parallel legs extending from said central region, wherein at least a portion of said central region is disposed in the second notch and wherein at least a portion of each leg covers at least a portion of a respective surface of the magnetic field sensing element.

29. The apparatus of claim 1, further including:
  a lead frame having a plurality of leads;
  a current conductor portion comprising a coupling of at least two of the plurality of leads, wherein the current conductor portion is disposed proximate the first surface of the substrate.

* * * * *

UNITED STATES PATENT AND TRADEMARK OFFICE
CERTIFICATE OF CORRECTION

PATENT NO. : 7,358,724 B2
APPLICATION NO. : 11/129933
DATED : April 15, 2008
INVENTOR(S) : Taylor et al.

It is certified that error appears in the above-identified patent and that said Letters Patent is hereby corrected as shown below:

Column 2, line 18 delete "that" and replace with --that the--.

Column 6, line 44 delete "extensions 102 were" and replace with --extension 102 was--.

Column 7, line 8 delete "insulting" and replace with --insulating--.

Column 7, line 11, delete ", and insulating" and replace with --, an insulating--.

Column 7, line 13 delete "extension 106 The" and replace with --extension 106. The--.

Column 8, line 57 delete "flip-ship" and replace with --flip-chip--.

Column 8, line 65 delete "surface" and replace with --surfaces--.

Column 12, line 38 delete "though" and replace with --through--.

Column 13, line 16 delete "responsive to responsive to a" and replace with --responsive to a--.

Column 13, line 17 delete "though" and replace with --through--.

Column 13, line 43 delete "element 906 it" and replace with --element 906, it--.

Column 14, line 6 delete "responsive to responsive to a" and replace with --responsive to a--.

UNITED STATES PATENT AND TRADEMARK OFFICE
CERTIFICATE OF CORRECTION

| | |
|---|---|
| PATENT NO. | : 7,358,724 B2 |
| APPLICATION NO. | : 11/129933 |
| DATED | : April 15, 2008 |
| INVENTOR(S) | : Taylor et al. |

It is certified that error appears in the above-identified patent and that said Letters Patent is hereby corrected as shown below:

Column 14, line 7 delete "though" and replace with --through--.

Column 14, line 54 delete "1122a-122c" and replace with --1122a-1122c--.

Column 15, line 13 delete "though" and replace with --through--.

Signed and Sealed this

Twenty-first Day of October, 2008

JON W. DUDAS
*Director of the United States Patent and Trademark Office*